United States Patent
Sirski et al.

(10) Patent No.: US 12,414,385 B2
(45) Date of Patent: Sep. 9, 2025

(54) PHOTOVOLTAIC MODULES WITH OFFSET LAYERS

(71) Applicant: GAF Energy LLC, Parsippany, NJ (US)

(72) Inventors: William Sirski, San Jose, CA (US); Emma Dohner, San Francisco, CA (US); Nicholas Boitnott, San Francisco, CA (US)

(73) Assignee: GAF Energy LLC, Parsippany, NJ (US)

( * ) Notice: Subject to any disclaimer, the term of this patent is extended or adjusted under 35 U.S.C. 154(b) by 0 days.

(21) Appl. No.: 18/457,114

(22) Filed: Aug. 28, 2023

(65) Prior Publication Data

US 2024/0072187 A1 Feb. 29, 2024

Related U.S. Application Data

(60) Provisional application No. 63/401,976, filed on Aug. 29, 2022.

(51) Int. Cl.
*H10F 19/85* (2025.01)
*H02S 20/24* (2014.01)

(52) U.S. Cl.
CPC ............ *H10F 19/85* (2025.01); *H02S 20/24* (2014.12)

(58) Field of Classification Search
CPC ....... H01L 31/049; H02S 20/23; H02S 20/24; H10F 19/80; H10F 19/85
See application file for complete search history.

(56) References Cited

U.S. PATENT DOCUMENTS

| 1,981,467 A | 11/1934 | Radtke |
| 3,156,497 A | 11/1964 | Lessard |
| 4,258,948 A | 3/1981 | Hoffmann |

(Continued)

FOREIGN PATENT DOCUMENTS

| CA | 2829440 A | 5/2019 |
| CH | 700095 A2 | 6/2010 |

(Continued)

OTHER PUBLICATIONS

Sunflare, Procducts: "Sunflare Develops Prototype For New Residential Solar Shingles"; 2019 <<sunflaresolar.com/news/sunflare-develops-prototype-for-new-residential-solar-shingles>> retrieved Feb. 2, 2021.

(Continued)

*Primary Examiner* — Golam Mowla
(74) *Attorney, Agent, or Firm* — GREENBERG TRAURIG, LLP

(57) ABSTRACT

A system includes a plurality of photovoltaic modules installed on a roof deck. Each of the photovoltaic modules includes solar cells, a first encapsulant encapsulating the solar cells, a frontsheet and a backsheet. The front sheet includes a glass layer. The backsheet includes a first layer and a second layer. Each of the first and second layers includes first, second, third and fourth edges. The first edge of the first layer is offset from the first edge of the second layer, the second edge of the first layer is offset from the second edge of the second layer, the third edge of the first layer is offset from the third edge of the second layer, and the fourth edge of the first layer is offset from the fourth edge of the second layer.

19 Claims, 6 Drawing Sheets

(56) References Cited

U.S. PATENT DOCUMENTS

| | | |
|---|---|---|
| 4,349,220 A | 9/1982 | Carroll et al. |
| 4,499,702 A | 2/1985 | Turner |
| 4,636,577 A | 1/1987 | Peterpaul |
| 5,167,579 A | 12/1992 | Rotter |
| 5,437,735 A | 8/1995 | Younan et al. |
| 5,590,495 A | 1/1997 | Bressler et al. |
| 5,642,596 A | 7/1997 | Waddington |
| 6,008,450 A | 12/1999 | Ohtsuka et al. |
| 6,033,270 A | 3/2000 | Stuart |
| 6,046,399 A | 4/2000 | Kapner |
| 6,201,180 B1 | 3/2001 | Meyer et al. |
| 6,215,060 B1 * | 4/2001 | Komori ................ B32B 27/308 |
| | | 156/196 |
| 6,220,329 B1 | 4/2001 | King et al. |
| 6,320,114 B1 | 11/2001 | Kuechler |
| 6,320,115 B1 | 11/2001 | Kataoka et al. |
| 6,336,304 B1 | 1/2002 | Mimura et al. |
| 6,341,454 B1 | 1/2002 | Koleoglou |
| 6,407,329 B1 | 6/2002 | Iino et al. |
| 6,576,830 B2 | 6/2003 | Nagao et al. |
| 6,928,781 B2 | 8/2005 | Desbois et al. |
| 6,972,367 B2 | 12/2005 | Federspiel et al. |
| 7,138,578 B2 | 11/2006 | Komamine |
| 7,155,870 B2 | 1/2007 | Almy |
| 7,178,295 B2 | 2/2007 | Dinwoodie |
| 7,487,771 B1 | 2/2009 | Eiffert et al. |
| 7,587,864 B2 | 9/2009 | McCaskill et al. |
| 7,678,990 B2 | 3/2010 | McCaskill et al. |
| 7,678,991 B2 | 3/2010 | McCaskill et al. |
| 7,748,191 B2 | 7/2010 | Podirsky |
| 7,819,114 B2 | 10/2010 | Augenbraun et al. |
| 7,824,191 B1 | 11/2010 | Podirsky |
| 7,832,176 B2 | 11/2010 | McCaskill et al. |
| 8,118,109 B1 | 2/2012 | Hacker |
| 8,168,880 B2 | 5/2012 | Jacobs et al. |
| 8,173,889 B2 | 5/2012 | Kalkanoglu et al. |
| 8,210,570 B1 | 7/2012 | Railkar et al. |
| 8,276,329 B2 | 10/2012 | Lenox |
| 8,312,693 B2 | 11/2012 | Cappelli |
| 8,319,093 B2 | 11/2012 | Kalkanoglu et al. |
| 8,333,040 B2 | 12/2012 | Shiao et al. |
| 8,371,076 B2 | 2/2013 | Jones et al. |
| 8,375,653 B2 | 2/2013 | Shiao et al. |
| 8,404,967 B2 | 3/2013 | Kalkanoglu et al. |
| 8,410,349 B2 | 4/2013 | Kalkanoglu et al. |
| 8,418,415 B2 | 4/2013 | Shiao et al. |
| 8,438,796 B2 | 5/2013 | Shiao et al. |
| 8,468,754 B2 | 6/2013 | Railkar et al. |
| 8,468,757 B2 | 6/2013 | Krause et al. |
| 8,505,249 B2 | 8/2013 | Geary |
| 8,512,866 B2 | 8/2013 | Taylor |
| 8,513,517 B2 | 8/2013 | Kalkanoglu et al. |
| 8,586,856 B2 | 11/2013 | Kalkanoglu et al. |
| 8,601,754 B2 | 12/2013 | Jenkins et al. |
| 8,629,578 B2 | 1/2014 | Kurs et al. |
| 8,646,228 B2 | 2/2014 | Jenkins |
| 8,656,657 B2 | 2/2014 | Livsey et al. |
| 8,671,630 B2 | 3/2014 | Lena et al. |
| 8,677,702 B2 | 3/2014 | Jenkins |
| 8,695,289 B2 | 4/2014 | Koch et al. |
| 8,713,858 B1 | 5/2014 | Xie |
| 8,713,860 B2 | 5/2014 | Railkar et al. |
| 8,733,038 B2 | 5/2014 | Kalkanoglu et al. |
| 8,776,455 B2 | 7/2014 | Azoulay |
| 8,789,321 B2 | 7/2014 | Ishida |
| 8,793,940 B2 | 8/2014 | Kalkanoglu et al. |
| 8,793,941 B2 | 8/2014 | Bosler et al. |
| 8,826,607 B2 | 9/2014 | Shiao et al. |
| 8,835,751 B2 | 9/2014 | Kalkanoglu et al. |
| 8,863,451 B2 | 10/2014 | Jenkins et al. |
| 8,898,970 B2 | 12/2014 | Jenkins et al. |
| 8,925,262 B2 | 1/2015 | Railkar et al. |
| 8,943,766 B2 | 2/2015 | Gombarick et al. |
| 8,946,544 B2 | 2/2015 | Jabos et al. |
| 8,950,128 B2 | 2/2015 | Kalkanoglu et al. |
| 8,959,848 B2 | 2/2015 | Jenkins et al. |
| 8,966,838 B2 | 3/2015 | Jenkins |
| 8,966,850 B2 | 3/2015 | Jenkins et al. |
| 8,994,224 B2 | 3/2015 | Mehta et al. |
| 9,032,672 B2 | 5/2015 | Livsey et al. |
| 9,153,950 B2 | 10/2015 | Yamanaka et al. |
| 9,166,087 B2 | 10/2015 | Chihlas et al. |
| 9,169,646 B2 | 10/2015 | Rodrigues et al. |
| 9,170,034 B2 | 10/2015 | Bosler et al. |
| 9,178,465 B2 | 11/2015 | Shiao et al. |
| 9,202,955 B2 | 12/2015 | Livsey et al. |
| 9,212,832 B2 | 12/2015 | Jenkins |
| 9,217,584 B2 | 12/2015 | Kalkanoglu et al. |
| 9,270,221 B2 | 2/2016 | Zhao |
| 9,273,885 B2 | 3/2016 | Rordigues et al. |
| 9,276,141 B2 | 3/2016 | Kalkanoglu et al. |
| 9,331,224 B2 | 5/2016 | Koch et al. |
| 9,356,174 B2 | 5/2016 | Duarte et al. |
| 9,359,014 B1 | 6/2016 | Yang et al. |
| 9,412,890 B1 | 8/2016 | Meyers |
| 9,528,270 B2 | 12/2016 | Jenkins et al. |
| 9,605,432 B1 | 3/2017 | Robbins |
| 9,711,672 B2 | 7/2017 | Wang |
| 9,755,573 B2 | 9/2017 | Livsey et al. |
| 9,786,802 B2 | 10/2017 | Shiao et al. |
| 9,831,818 B2 | 11/2017 | West |
| 9,912,284 B2 | 3/2018 | Svec |
| 9,923,515 B2 | 3/2018 | Rodrigues et al. |
| 9,938,729 B2 | 4/2018 | Coon |
| 9,991,412 B2 | 6/2018 | Gonzalez et al. |
| 9,998,067 B2 | 6/2018 | Kalkanoglu et al. |
| 10,027,273 B2 | 7/2018 | West et al. |
| 10,115,850 B2 | 10/2018 | Rodrigues et al. |
| 10,128,660 B1 | 11/2018 | Apte et al. |
| 10,156,075 B1 | 12/2018 | McDonough |
| 10,187,005 B2 | 1/2019 | Rodrigues et al. |
| 10,256,765 B2 | 4/2019 | Rodrigues et al. |
| 10,284,136 B1 | 5/2019 | Mayfield et al. |
| 10,454,408 B2 | 10/2019 | Livsey et al. |
| 10,530,292 B1 | 1/2020 | Cropper et al. |
| 10,560,048 B2 | 2/2020 | Fisher et al. |
| 10,563,406 B2 | 2/2020 | Kalkanoglu et al. |
| D879,031 S | 3/2020 | Lance et al. |
| 10,784,813 B2 | 9/2020 | Kalkanoglu et al. |
| D904,289 S | 12/2020 | Lance et al. |
| 11,012,026 B2 | 5/2021 | Kalkanoglu et al. |
| 11,177,639 B1 | 11/2021 | Nguyen et al. |
| 11,217,715 B2 | 1/2022 | Sharenko |
| 11,251,744 B1 | 2/2022 | Bunea |
| 11,258,399 B2 | 2/2022 | Kalkanoglu et al. |
| 11,283,394 B2 | 3/2022 | Perkins et al. |
| 11,309,828 B2 | 4/2022 | Sirski et al. |
| 11,394,344 B2 | 7/2022 | Perkins et al. |
| 11,424,379 B2 | 8/2022 | Sharenko et al. |
| 11,431,280 B2 | 8/2022 | Liu et al. |
| 11,431,281 B2 | 8/2022 | Perkins et al. |
| 11,444,569 B2 | 9/2022 | Clemente et al. |
| 11,454,027 B2 | 9/2022 | Kuiper et al. |
| 11,459,757 B2 | 10/2022 | Nguyen et al. |
| 11,486,144 B2 | 11/2022 | Bunea et al. |
| 11,489,482 B2 | 11/2022 | Peterson et al. |
| 11,496,088 B2 | 11/2022 | Sirski et al. |
| 11,508,861 B1 | 11/2022 | Perkins et al. |
| 11,512,480 B1 | 11/2022 | Achor et al. |
| 11,527,665 B2 | 12/2022 | Boitnott |
| 11,545,927 B2 | 1/2023 | Abra et al. |
| 11,545,928 B2 | 1/2023 | Perkins et al. |
| 11,658,470 B2 | 5/2023 | Nguyen et al. |
| 11,661,745 B2 | 5/2023 | Bunea et al. |
| 11,689,149 B2 | 6/2023 | Clemente et al. |
| 11,705,531 B2 | 7/2023 | Sharenko et al. |
| 11,728,759 B2 | 8/2023 | Nguyen et al. |
| 11,732,490 B2 | 8/2023 | Achor et al. |
| 11,811,361 B1 | 11/2023 | Farhangi et al. |
| 11,824,486 B2 | 11/2023 | Nguyen et al. |
| 11,824,487 B2 | 11/2023 | Nguyen et al. |
| 11,843,067 B2 | 12/2023 | Nguyen et al. |
| 2002/0053360 A1 | 5/2002 | Kinoshita et al. |
| 2002/0129849 A1 | 9/2002 | Heckeroth |

(56) References Cited

U.S. PATENT DOCUMENTS

| | | |
|---|---|---|
| 2003/0101662 A1 | 6/2003 | Ullman |
| 2003/0132265 A1 | 7/2003 | Villela et al. |
| 2003/0217768 A1 | 11/2003 | Guha |
| 2004/0000334 A1 | 1/2004 | Ressler |
| 2005/0030187 A1 | 2/2005 | Peress et al. |
| 2005/0115603 A1 | 6/2005 | Yoshida et al. |
| 2005/0144870 A1 | 7/2005 | Dinwoodie |
| 2005/0178428 A1 | 8/2005 | Laaly et al. |
| 2006/0042683 A1 | 3/2006 | Gangemi |
| 2006/0046084 A1 | 3/2006 | Yang et al. |
| 2007/0074757 A1 | 4/2007 | Mellott et al. |
| 2007/0181174 A1 | 8/2007 | Ressler |
| 2007/0193618 A1 | 8/2007 | Bressler et al. |
| 2007/0249194 A1 | 10/2007 | Liao |
| 2007/0295385 A1 | 12/2007 | Sheats et al. |
| 2008/0006323 A1 | 1/2008 | Kalkanoglu et al. |
| 2008/0035140 A1 | 2/2008 | Placer et al. |
| 2008/0078440 A1 | 4/2008 | Lim et al. |
| 2008/0185748 A1 | 8/2008 | Kalkanoglu |
| 2008/0271774 A1 | 11/2008 | Kalkanoglu et al. |
| 2008/0302030 A1 | 12/2008 | Stancel et al. |
| 2008/0315061 A1 | 12/2008 | Fath |
| 2009/0000222 A1 | 1/2009 | Kalkanoglu et al. |
| 2009/0014058 A1 | 1/2009 | Croft et al. |
| 2009/0019795 A1 | 1/2009 | Szacsvay et al. |
| 2009/0044850 A1 | 2/2009 | Kimberley |
| 2009/0114261 A1 | 5/2009 | Stancel et al. |
| 2009/0133340 A1 | 5/2009 | Shiao et al. |
| 2009/0159118 A1 | 6/2009 | Kalkanoglu et al. |
| 2009/0178350 A1 | 7/2009 | Kalkanoglu et al. |
| 2009/0229652 A1 | 9/2009 | Mapel et al. |
| 2009/0275247 A1 | 11/2009 | Richter et al. |
| 2010/0019580 A1 | 1/2010 | Croft et al. |
| 2010/0095618 A1 | 4/2010 | Edison et al. |
| 2010/0101634 A1 | 4/2010 | Frank et al. |
| 2010/0116325 A1 | 5/2010 | Nikoonahad |
| 2010/0131108 A1 | 5/2010 | Meyer |
| 2010/0139184 A1 | 6/2010 | Williams et al. |
| 2010/0146878 A1 | 6/2010 | Koch et al. |
| 2010/0159221 A1 | 6/2010 | Kourtakis et al. |
| 2010/0170169 A1 | 7/2010 | Railkar et al. |
| 2010/0186798 A1 | 7/2010 | Tormen et al. |
| 2010/0242381 A1 | 9/2010 | Jenkins |
| 2010/0313499 A1 | 12/2010 | Gangemi |
| 2010/0326488 A1 | 12/2010 | Aue et al. |
| 2010/0326501 A1 | 12/2010 | Zhao et al. |
| 2011/0030761 A1 | 2/2011 | Kalkanoglu et al. |
| 2011/0036386 A1 | 2/2011 | Browder |
| 2011/0036389 A1 | 2/2011 | Hardikar et al. |
| 2011/0048507 A1 | 3/2011 | Livsey et al. |
| 2011/0058337 A1 | 3/2011 | Han et al. |
| 2011/0061326 A1 | 3/2011 | Jenkins |
| 2011/0100436 A1 | 5/2011 | Cleereman et al. |
| 2011/0104488 A1 | 5/2011 | Muessig et al. |
| 2011/0132427 A1 | 6/2011 | Kalkanoglu et al. |
| 2011/0168238 A1 | 7/2011 | Metin et al. |
| 2011/0239555 A1 | 10/2011 | Cook et al. |
| 2011/0302859 A1 | 12/2011 | Crasnianski |
| 2012/0034799 A1 | 2/2012 | Hunt |
| 2012/0060902 A1 | 3/2012 | Drake |
| 2012/0085392 A1 | 4/2012 | Albert et al. |
| 2012/0137600 A1 | 6/2012 | Jenkins |
| 2012/0176077 A1 | 7/2012 | Oh et al. |
| 2012/0212065 A1 | 8/2012 | Cheng et al. |
| 2012/0233940 A1 | 9/2012 | Perkins et al. |
| 2012/0240490 A1 | 9/2012 | Gangemi |
| 2012/0260977 A1 | 10/2012 | Stancel |
| 2012/0266942 A1 | 10/2012 | Komatsu et al. |
| 2012/0279150 A1 | 11/2012 | Pislkak et al. |
| 2012/0282437 A1 | 11/2012 | Clark et al. |
| 2012/0291848 A1 | 11/2012 | Sherman et al. |
| 2013/0008499 A1 | 1/2013 | Verger et al. |
| 2013/0014455 A1 | 1/2013 | Grieco |
| 2013/0118558 A1 | 5/2013 | Sherman |
| 2013/0193769 A1 | 8/2013 | Mehta et al. |
| 2013/0247988 A1 | 9/2013 | Reese et al. |
| 2013/0284267 A1 | 10/2013 | Plug et al. |
| 2013/0306137 A1 | 11/2013 | Ko |
| 2014/0090697 A1 | 4/2014 | Rodrigues et al. |
| 2014/0150843 A1 | 6/2014 | Pearce et al. |
| 2014/0173997 A1 | 6/2014 | Jenkins |
| 2014/0179220 A1 | 6/2014 | Railkar et al. |
| 2014/0182222 A1 | 7/2014 | Kalkanoglu et al. |
| 2014/0254776 A1 | 9/2014 | O'Connor et al. |
| 2014/0266289 A1 | 9/2014 | Della Sera et al. |
| 2014/0311556 A1 | 10/2014 | Feng et al. |
| 2014/0352760 A1 | 12/2014 | Haynes et al. |
| 2014/0366464 A1 | 12/2014 | Rodrigues et al. |
| 2015/0089895 A1 | 4/2015 | Leitch |
| 2015/0129013 A1 * | 5/2015 | Nositschka ........... H01L 31/048 438/66 |
| 2015/0162459 A1 | 6/2015 | Lu et al. |
| 2015/0340516 A1 | 11/2015 | Kim et al. |
| 2015/0349173 A1 | 12/2015 | Morad et al. |
| 2016/0105144 A1 | 4/2016 | Haynes et al. |
| 2016/0142008 A1 | 5/2016 | Lopez et al. |
| 2016/0254776 A1 | 9/2016 | Rodrigues et al. |
| 2016/0276508 A1 | 9/2016 | Huang et al. |
| 2016/0359451 A1 | 12/2016 | Mao et al. |
| 2017/0159292 A1 | 6/2017 | Chihlas et al. |
| 2017/0179319 A1 | 6/2017 | Yamashita et al. |
| 2017/0179726 A1 | 6/2017 | Garrity et al. |
| 2017/0237390 A1 | 8/2017 | Hudson et al. |
| 2017/0331415 A1 | 11/2017 | Koppi et al. |
| 2018/0094438 A1 | 4/2018 | Wu et al. |
| 2018/0097472 A1 | 4/2018 | Anderson et al. |
| 2018/0115275 A1 | 4/2018 | Flanigan et al. |
| 2018/0254738 A1 | 9/2018 | Yang et al. |
| 2018/0351502 A1 | 12/2018 | Almy et al. |
| 2018/0367089 A1 | 12/2018 | Stutterheim et al. |
| 2019/0030867 A1 | 1/2019 | Sun et al. |
| 2019/0081436 A1 | 3/2019 | Onodi et al. |
| 2019/0123679 A1 | 4/2019 | Rodrigues et al. |
| 2019/0253022 A1 | 8/2019 | Hardar et al. |
| 2019/0305717 A1 | 10/2019 | Allen et al. |
| 2020/0109320 A1 | 4/2020 | Jiang |
| 2020/0144958 A1 | 5/2020 | Rodrigues et al. |
| 2020/0220819 A1 | 7/2020 | Vu et al. |
| 2020/0224419 A1 | 7/2020 | Boss et al. |
| 2020/0343397 A1 | 10/2020 | Hem-Jensen |
| 2021/0115223 A1 | 4/2021 | Bonekamp et al. |
| 2021/0159353 A1 | 5/2021 | Li et al. |
| 2021/0343886 A1 | 11/2021 | Sharenko et al. |
| 2022/0149213 A1 | 5/2022 | Mensink et al. |

FOREIGN PATENT DOCUMENTS

| | | | |
|---|---|---|---|
| CN | 202797032 U | 3/2013 | |
| DE | 1958248 A1 | 11/1971 | |
| EP | 0 884 432 A2 * | 12/1998 | ........... H01L 31/048 |
| EP | 1039361 A1 | 9/2000 | |
| EP | 1837162 A1 | 9/2007 | |
| EP | 1774372 A1 | 7/2011 | |
| EP | 2446481 A2 | 5/2012 | |
| EP | 2784241 A1 | 10/2014 | |
| JP | 10046767 A | 2/1998 | |
| JP | 2002-106151 A | 4/2002 | |
| JP | 2001-098703 A | 10/2002 | |
| JP | 2017-027735 A | 2/2017 | |
| JP | 2018053707 A | 4/2018 | |
| KR | 20090084060 A | 8/2009 | |
| KR | 10-2019-0000367 A | 1/2019 | |
| KR | 10-2253483 B1 | 5/2021 | |
| NL | 2026856 B1 | 6/2022 | |
| WO | 2011/049944 A1 | 4/2011 | |
| WO | 2015/133632 A1 | 9/2015 | |
| WO | 2018/000589 A1 | 1/2018 | |
| WO | 2019/201416 A1 | 10/2019 | |
| WO | 2020-159358 A1 | 8/2020 | |
| WO | 2021-247098 A1 | 12/2021 | |

(56) References Cited

OTHER PUBLICATIONS

RGS Energy, 3.5kW Powerhouse 3.0 system installed in an afternoon; Jun. 7, 2019 <<facebook.com/RGSEnergy/>> retrieved Feb. 2, 2021.
Tesla, Solar Roof <<tesla.com/solarroof>> retrieved Feb. 2, 2021.
"Types of Roofing Underlayment", Owens Corning Roofing; <<https://www.owenscorning.com/en-us/roofing/tools/how-roofing-underlayment-helps-protect-your-home>> retrieved Nov. 1, 2021.

* cited by examiner

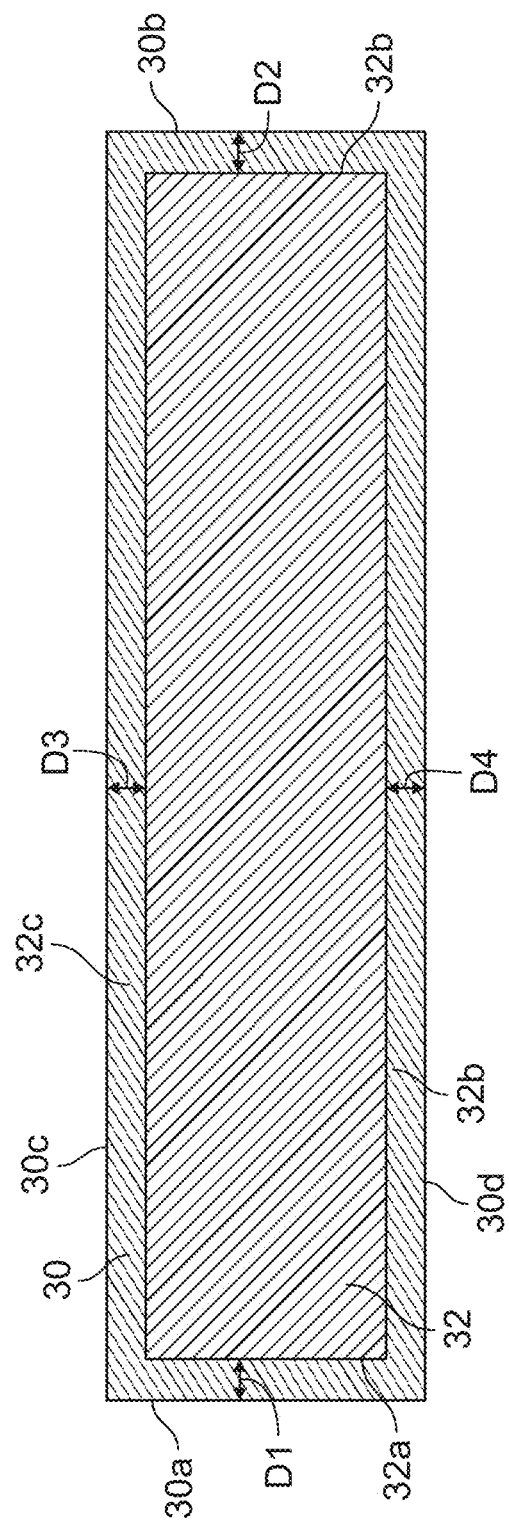
FIG. 5
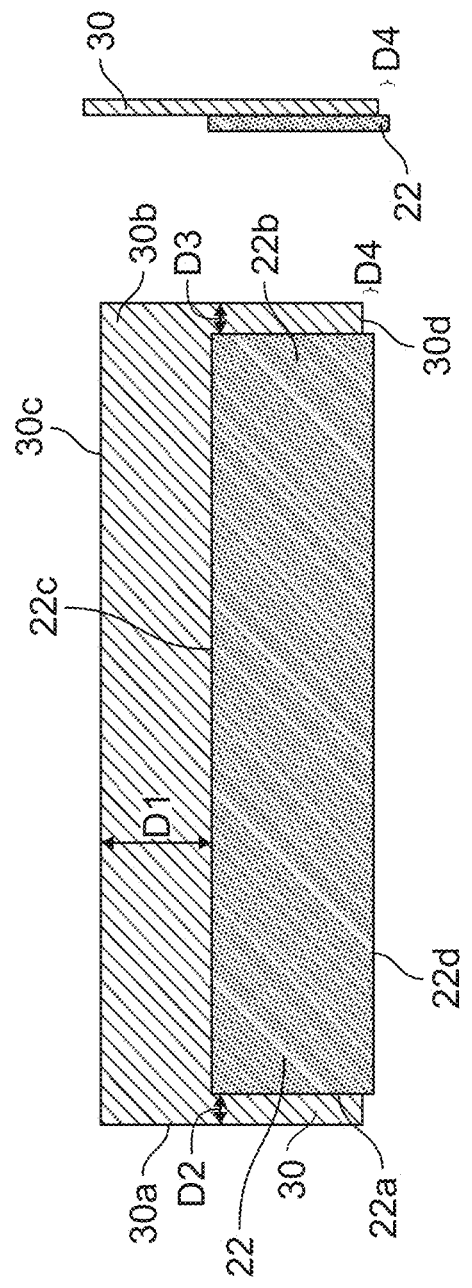
FIG. 6
FIG. 7

PHOTOVOLTAIC MODULES WITH OFFSET LAYERS

CROSS-REFERENCE TO RELATED APPLICATION

This application is a Section 111(a) application relating to and claiming the benefit of commonly owned, U.S. Provisional Patent Application Ser. No. 63/401,976, filed Aug. 29, 2022, entitled "PHOTOVOLTAIC MODULES WITH OFFSET LAYERS," the contents of each of which are incorporated herein by reference in its entirety.

FIELD OF THE INVENTION

The present invention relates to photovoltaic modules, and, more particularly, photovoltaic modules having offset layers.

BACKGROUND

Photovoltaic systems having solar panels are commonly installed on roofing of structures.

SUMMARY

In some embodiments, a system comprises a plurality of photovoltaic modules installed on a roof deck, wherein each of the photovoltaic modules includes at least one solar cell, a first encapsulant encapsulating the at least one solar cell, wherein the first encapsulant includes a first surface and a second surface opposite the first surface, a frontsheet juxtaposed with the first surface of the first encapsulant, wherein the frontsheet includes a glass layer, and a backsheet juxtaposed with the second surface of the first encapsulant, wherein the backsheet includes a first layer, wherein the first layer includes a first edge, a second edge opposite the first edge, a third edge extending from the first edge to the second edge, and a fourth edge opposite the third edge and extending from the first edge to the second edge, and a second layer adjacent the first layer, wherein the second layer includes a first edge, a second edge opposite the first edge of the second layer, a third edge extending from the first edge of the second layer to the second edge of the second layer, and a fourth edge opposite the third edge of the second layer and extending from the first edge of the second layer to the second edge of the second layer, wherein the first edge of the first layer is offset from the first edge of the second layer, wherein the second edge of the first layer is offset from the second edge of the second layer, wherein the third edge of the first layer is offset from the third edge of the second layer, and wherein the fourth edge of the first layer is offset from the fourth edge of the second layer.

In some embodiments, a second layer forms a lower surface of the photovoltaic module. In some embodiments, the first layer includes a first length extending from the first edge of the first layer to the second edge of the first layer, wherein the second layer includes a second length extending from the first edge of the second layer to the second edge of the second layer, and wherein the first length is greater than the second length. In some embodiments, the first layer includes a first width extending from the third edge of the first layer to the fourth edge of the first layer, wherein the second layer includes a second width extending from the third edge of the second layer to the fourth edge of the second layer, and wherein the first width is greater than the second width. In some embodiments, the second layer is composed of thermoplastic polyolefin (TPO). In some embodiments, the first layer is composed of a polymer. In some embodiments, the first layer is composed of thermoplastic polyolefin (TPO).

In some embodiments, the glass layer includes a first edge, a second edge opposite the first edge of the glass layer, a third edge extending from the first edge of the glass layer to the second edge of the glass layer, and a fourth edge opposite the third edge of the glass layer and extending from the first edge of the glass layer to the second edge of the glass layer, wherein the first edge of the glass layer is offset from the first edge of the second layer, wherein the second edge of the glass layer is offset from the second edge of the second layer, wherein the third edge of the glass layer is offset from the third edge of the second layer, and wherein the fourth edge of the glass layer is offset from the fourth edge of the second layer.

In some embodiments, the first layer includes a first length extending from the first edge of the first layer to the second edge of the first layer, wherein the second layer includes a second length extending from the first edge of the second layer to the second edge of the second layer, and wherein the second length is greater than the first length. In some embodiments, the first layer includes a first width extending from the third edge of the first layer to the fourth edge of the first layer, wherein the second layer includes a second width extending from the third edge of the second layer to the fourth edge of the second layer, and wherein the second width is greater than the first width.

In some embodiments, first layer is composed of thermoplastic polyolefin (TPO). In some embodiments, the second layer is composed of a polymer. In some embodiments, the second layer is composed of thermoplastic polyolefin (TPO).

In some embodiments, glass layer includes a first edge, a second edge opposite the first edge of the glass layer, a third edge extending from the first edge of the glass layer to the second edge of the glass layer, and a fourth edge opposite the third edge of the glass layer and extending from the first edge of the glass layer to the second edge of the glass layer, wherein the first edge of the glass layer is offset from the first edge of the first layer, wherein the second edge of the glass layer is offset from the second edge of the first layer, wherein the third edge of the glass layer is offset from the third edge of the first layer, and wherein the fourth edge of the glass layer is offset from the fourth edge of the first layer.

In some embodiments, the first edge of the first layer is offset from the first edge of the second layer by a first distance, wherein the second edge of the first layer is offset from the second edge of the second layer by a second distance, wherein the third edge of the first layer is offset from the third edge of the second layer by a third distance, and wherein the fourth edge of the first layer is offset from the fourth edge of the second layer by a fourth distance. In some embodiments, the first distance, the second distance, the third distance and the fourth distance are equal to one another. In some embodiments, the first distance is equal to the second distance, and wherein the third distance is equal to the fourth distance. In some embodiments, the first layer and the second layer are attached to one another by an adhesive layer. In some embodiments, the frontsheet includes a polymer layer and a second encapsulant, and wherein the polymer layer is attached to the glass layer by the second encapsulant.

In some embodiments, a photovoltaic module includes at least one solar cell, a first encapsulant encapsulating the at least one solar cell, wherein the first encapsulant includes a first surface and a second surface opposite the first surface, a frontsheet juxtaposed with the first surface of the first encapsulant, wherein the frontsheet includes a glass layer, and a backsheet juxtaposed with the second surface of the first encapsulant, wherein the backsheet includes a first layer, wherein the first layer includes a first edge, a second edge opposite the first edge, a third edge extending from the first edge to the second edge, and a fourth edge opposite the third edge and extending from the first edge to the second edge, and a second layer attached to the first layer, wherein the second layer includes a first edge, a second edge opposite the first edge of the second layer, a third edge extending from the first edge of the second layer to the second edge of the second layer, and a fourth edge opposite the third edge of the second layer and extending from the first edge of the second layer to the second edge of the second layer, wherein the first edge of the first layer is offset from the first edge of the second layer, wherein the second edge of the first layer is offset from the second edge of the second layer, wherein the third edge of the first layer is offset from the third edge of the second layer, and wherein the fourth edge of the first layer is offset from the fourth edge of the second layer, wherein the second layer forms a lower surface of the photovoltaic module, and wherein at least one of the first layer and the second layer is composed of thermoplastic polyolefin (TPO).

BRIEF DESCRIPTION OF THE DRAWINGS

FIGS. 5 through 7 are schematic views of some embodiments of a photovoltaic module.

DETAILED DESCRIPTION

The present invention will be further explained with reference to the attached drawings, wherein like structures are referred to by like numerals throughout the several views. The drawings shown are not necessarily to scale, with emphasis instead generally being placed upon illustrating the principles of the present invention. Further, some features may be exaggerated to show details of particular components.

The figures constitute a part of this specification and include illustrative embodiments of the present invention and illustrate various objects and features thereof. Further, the figures are not necessarily to scale, some features may be exaggerated to show details of particular components. In addition, any measurements, specifications and the like shown in the figures are intended to be illustrative, and not restrictive. Therefore, specific structural and functional details disclosed herein are not to be interpreted as limiting, but merely as a representative basis for teaching one skilled in the art to variously employ the present invention.

Among those benefits and improvements that have been disclosed, other objects and advantages of this invention will become apparent from the following description taken in conjunction with the accompanying figures. Detailed embodiments of the present invention are disclosed herein; however, it is to be understood that the disclosed embodiments are merely illustrative of the invention that may be embodied in various forms. In addition, each of the examples given in connection with the various embodiments of the invention which are intended to be illustrative, and not restrictive.

Throughout the specification, the following terms take the meanings explicitly associated herein, unless the context clearly dictates otherwise. The phrases "in one embodiment" and "in some embodiments" as used herein do not necessarily refer to the same embodiment(s), though they may. Furthermore, the phrases "in another embodiment" and "in some other embodiments" as used herein do not necessarily refer to a different embodiment, although they may. Thus, as described below, various embodiments of the invention may be readily combined, without departing from the scope or spirit of the invention.

The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Figure 1:
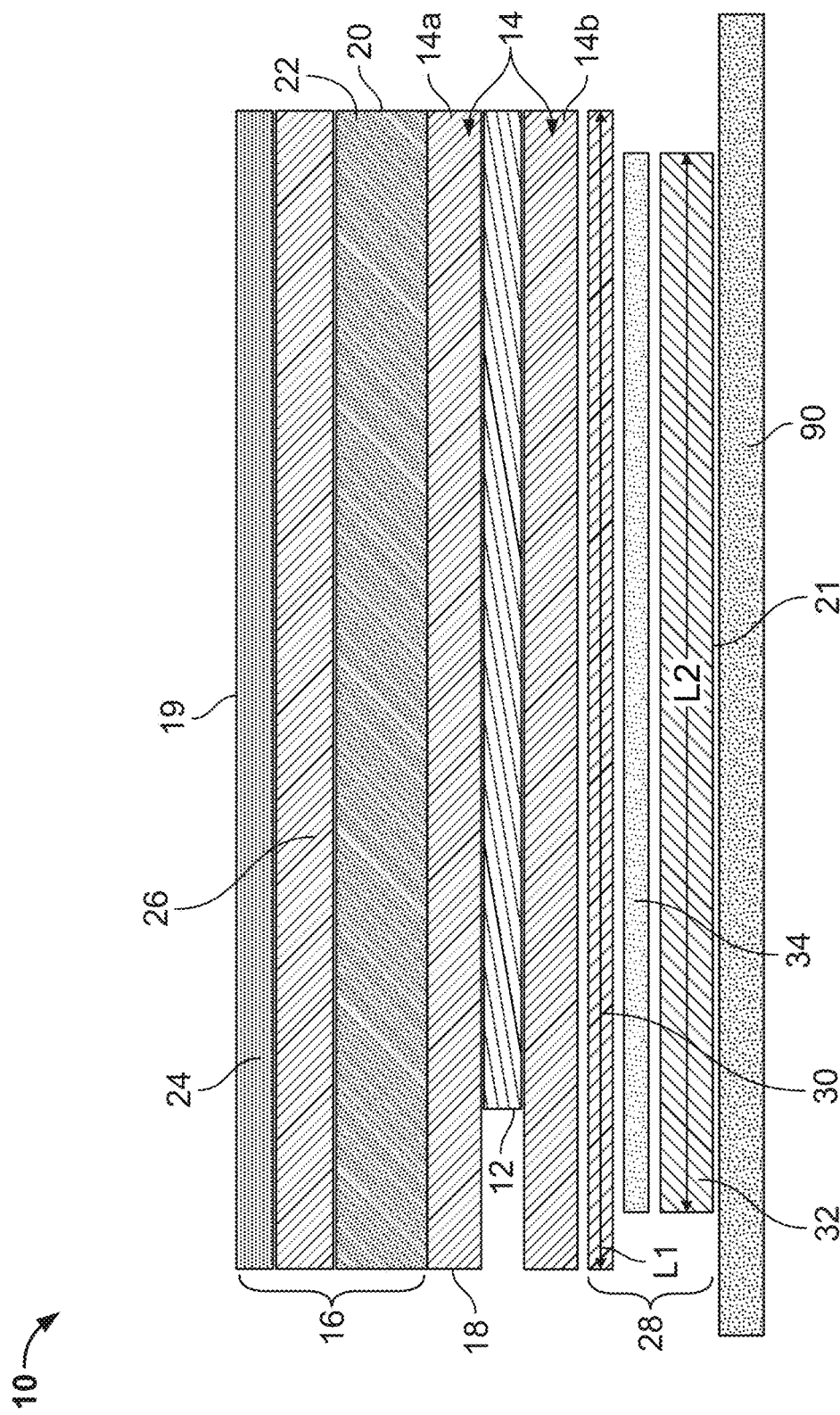
FIG. 1 is a schematic view of some embodiments of a photovoltaic module.
Figure 2:
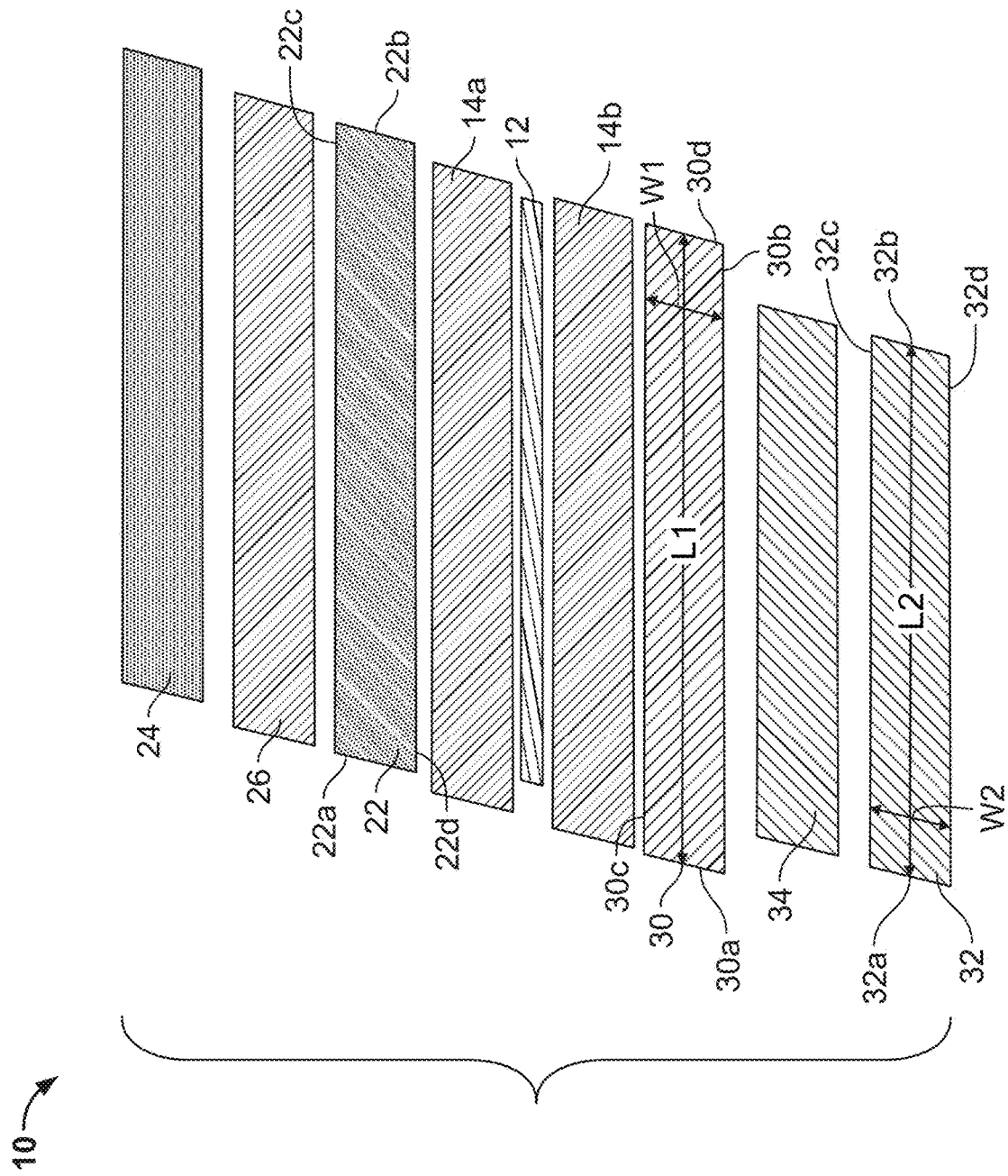
FIG. 2 is a perspective, schematic view of some embodiments of a photovoltaic module.
Figure 3:
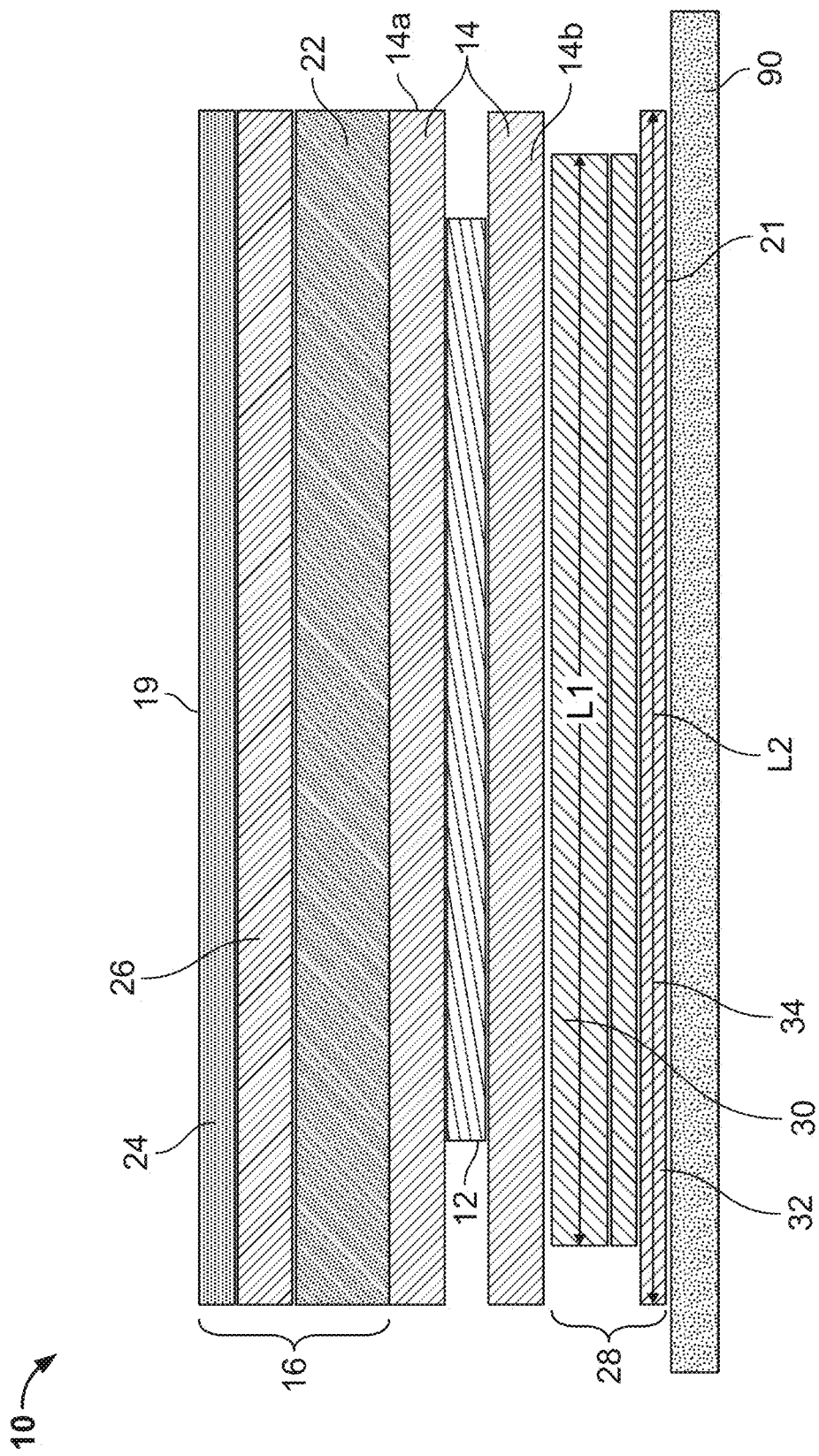
FIGS. 3 and 4 are schematic views of some embodiments of a photovoltaic module.

Referring to FIGS. 1 through 3, in some embodiments, a photovoltaic module 10 includes at least one solar cell 12, an encapsulant 14 encapsulating the at least one solar cell 12, and a frontsheet 16 juxtaposed with the encapsulant 14. In some embodiments, the frontsheet 16 is juxtaposed with a first surface of the encapsulant 14. As used herein, the terms "encapsulating" and "encapsulates" mean to partially or fully envelope or enclose, and with respect to certain embodiments of the photovoltaic module 10, the at least one solar cell 12 is fully enveloped by or enclosed within the encapsulant 14, or partially enveloped by or enclosed within the encapsulant 14. In some embodiments, the encapsulant 14 encapsulates 50% to 99.9% of an exterior surface area of the at least one solar cell 12. In another embodiment, the encapsulant 14 encapsulates 55% to 99.9% of an exterior surface area of the at least one solar cell 12. In another embodiment, the encapsulant 14 encapsulates 60% to 99.9% of an exterior surface area of the at least one solar cell 12. In another embodiment, the encapsulant 14 encapsulates 65% to 99.9% of an exterior surface area of the at least one solar cell 12. In another embodiment, the encapsulant 14 encapsulates 70% to 99.9% of an exterior surface area of the at least one solar cell 12. In another embodiment, the encapsulant 14 encapsulates 75% to 99.9% of an exterior surface area of the at least one solar cell 12. In another embodiment, the encapsulant 14 encapsulates 80% to 99.9% of an exterior surface area of the at least one solar cell 12. In another embodiment, the encapsulant 14 encapsulates 85% to 99.9% of an exterior surface area of the at least one solar cell 12. In another embodiment, the encapsulant 14 encapsulates 90% to 99.9% of an exterior surface area of the at least one solar cell 12. In another embodiment, the encapsulant 14 encapsulates 95% to 99.9% of an exterior surface area of the at least one solar cell 12.

In another embodiment, the encapsulant 14 encapsulates 50% to 95% of an exterior surface area of the at least one solar cell 12. In another embodiment, the encapsulant 14 encapsulates 55% to 95% of an exterior surface area of the at least one solar cell 12. In another embodiment, the encapsulant 14 encapsulates 60% to 95% of an exterior surface area of the at least one solar cell 12. In another embodiment, the encapsulant 14 encapsulates 65% to 95% of an exterior surface area of the at least one solar cell 12. In another embodiment, the encapsulant 14 encapsulates 70% to 95% of an exterior surface area of the at least one solar cell 12. In another embodiment, the encapsulant 14 encapsulates 75% to 95% of an exterior surface area of the at least one solar cell 12. In another embodiment, the encapsulant 14 encapsulates 80% to 95% of an exterior surface area of the at least one solar cell 12. In another embodiment, the encapsulant 14 encapsulates 85% to 95% of an exterior surface area of the at least one solar cell 12. In another embodiment, the encapsulant 14 encapsulates 90% to 95% of an exterior surface area of the at least one solar cell 12.

In another embodiment, the encapsulant 14 encapsulates 50% to 90% of an exterior surface area of the at least one solar cell 12. In another embodiment, the encapsulant 14 encapsulates 55% to 90% of an exterior surface area of the at least one solar cell 12. In another embodiment, the encapsulant 14 encapsulates 60% to 90% of an exterior surface area of the at least one solar cell 12. In another embodiment, the encapsulant 14 encapsulates 65% to 90% of an exterior surface area of the at least one solar cell 12. In another embodiment, the encapsulant 14 encapsulates 70% to 90% of an exterior surface area of the at least one solar cell 12. In another embodiment, the encapsulant 14 encapsulates 75% to 90% of an exterior surface area of the at least one solar cell 12. In another embodiment, the encapsulant 14 encapsulates 80% to 90% of an exterior surface area of the at least one solar cell 12. In another embodiment, the encapsulant 14 encapsulates 85% to 90% of an exterior surface area of the at least one solar cell 12.

In another embodiment, the encapsulant 14 encapsulates 50% to 85% of an exterior surface area of the at least one solar cell 12. In another embodiment, the encapsulant 14 encapsulates 55% to 85% of an exterior surface area of the at least one solar cell 12. In another embodiment, the encapsulant 14 encapsulates 60% to 85% of an exterior surface area of the at least one solar cell 12. In another embodiment, the encapsulant 14 encapsulates 65% to 85% of an exterior surface area of the at least one solar cell 12. In another embodiment, the encapsulant 14 encapsulates 70% to 85% of an exterior surface area of the at least one solar cell 12. In another embodiment, the encapsulant 14 encapsulates 75% to 85% of an exterior surface area of the at least one solar cell 12. In another embodiment, the encapsulant 14 encapsulates 80% to 85% of an exterior surface area of the at least one solar cell 12.

In another embodiment, the encapsulant 14 encapsulates 50% to 80% of an exterior surface area of the at least one solar cell 12. In another embodiment, the encapsulant 14 encapsulates 55% to 80% of an exterior surface area of the at least one solar cell 12. In another embodiment, the encapsulant 14 encapsulates 60% to 80% of an exterior surface area of the at least one solar cell 12. In another embodiment, the encapsulant 14 encapsulates 65% to 80% of an exterior surface area of the at least one solar cell 12. In another embodiment, the encapsulant 14 encapsulates 70% to 80% of an exterior surface area of the at least one solar cell 12. In another embodiment, the encapsulant 14 encapsulates 75% to 80% of an exterior surface area of the at least one solar cell 12.

In another embodiment, the encapsulant 14 encapsulates 50% to 75% of an exterior surface area of the at least one solar cell 12. In another embodiment, the encapsulant 14 encapsulates 55% to 75% of an exterior surface area of the at least one solar cell 12. In another embodiment, the encapsulant 14 encapsulates 60% to 75% of an exterior surface area of the at least one solar cell 12. In another embodiment, the encapsulant 14 encapsulates 65% to 75% of an exterior surface area of the at least one solar cell 12.

In another embodiment, the encapsulant 14 encapsulates 70% to 75% of an exterior surface area of the at least one solar cell 12.

In another embodiment, the encapsulant 14 encapsulates 50% to 70% of an exterior surface area of the at least one solar cell 12. In another embodiment, the encapsulant 14 encapsulates 55% to 70% of an exterior surface area of the at least one solar cell 12. In another embodiment, the encapsulant 14 encapsulates 60% to 70% of an exterior surface area of the at least one solar cell 12. In another embodiment, the encapsulant 14 encapsulates 65% to 70% of an exterior surface area of the at least one solar cell 12.

In another embodiment, the encapsulant 14 encapsulates 50% to 65% of an exterior surface area of the at least one solar cell 12. In another embodiment, the encapsulant 14 encapsulates 55% to 65% of an exterior surface area of the at least one solar cell 12. In another embodiment, the encapsulant 14 encapsulates 60% to 65% of an exterior surface area of the at least one solar cell 12. In another embodiment, the encapsulant 14 encapsulates 50% to 60% of an exterior surface area of the at least one solar cell 12. In another embodiment, the encapsulant 14 encapsulates 55% to 60% of an exterior surface area of the at least one solar cell 12. In another embodiment, the encapsulant 14 encapsulates 55% to 60% of an exterior surface area of the at least one solar cell 12.

In some embodiments, the encapsulant 14 encapsulates 50% of an exterior surface area of the at least one solar cell 12. In another embodiment, the encapsulant 14 encapsulates 55% of the exterior surface area of the at least one solar cell 12. In another embodiment, the encapsulant 14 encapsulates 60% of the exterior surface area of the at least one solar cell 12. In another embodiment, the encapsulant 14 encapsulates 65% of the exterior surface area of the at least one solar cell 12. In another embodiment, the encapsulant 14 encapsulates 70% of the exterior surface area of the at least one solar cell 12. In another embodiment, the encapsulant 14 encapsulates 75% of the exterior surface area of the at least one solar cell 12. In another embodiment, the encapsulant 14 encapsulates 80% of the exterior surface area of the at least one solar cell 12. In another embodiment, the encapsulant 14 encapsulates 85% of the exterior surface area of the at least one solar cell 12. In another embodiment, the encapsulant 14 encapsulates 90% of the exterior surface area of the at least one solar cell 12. In another embodiment, the encapsulant 14 encapsulates 95% of the exterior surface area of the at least one solar cell 12. In another embodiment, the encapsulant 14 encapsulates 100% of the exterior surface area of the at least one solar cell 12.

In some embodiments, the encapsulant 14 has a thickness of 0.5 mm to 4 mm. In another embodiment, the encapsulant 14 has a thickness of 0.5 mm to 3.5 mm. In another embodiment, the encapsulant 14 has a thickness of 0.5 mm to 3 mm. In another embodiment, the encapsulant 14 has a thickness of 0.5 mm to 2.5 mm. In another embodiment, the encapsulant 14 has a thickness of 0.5 mm to 2 mm. In another embodiment, the encapsulant 14 has a thickness of 0.5 mm to 1.5 mm. In another embodiment, the encapsulant 14 has a thickness of 0.5 mm to 1 mm.

In some embodiments, the encapsulant 14 has a thickness of 1 mm to 4 mm. In another embodiment, the encapsulant 14 has a thickness of 1 mm to 3.5 mm. In another embodiment, the encapsulant 14 has a thickness of 1 mm to 3 mm. In another embodiment, the encapsulant 14 has a thickness of 1 mm to 2.5 mm. In another embodiment, the encapsulant 14 has a thickness of 1 mm to 2 mm. In another embodiment, the encapsulant 14 has a thickness of 1 mm to 1.5 mm. In some embodiments, the encapsulant 14 has a thickness of 1.5 mm to 4 mm. In another embodiment, the encapsulant 14 has a thickness of 1.5 mm to 3.5 mm. In another embodiment, the encapsulant 14 has a thickness of 1.5 mm to 3 mm. In another embodiment, the encapsulant 14 has a thickness of 1.5 mm to 2.5 mm. In another embodiment, the encapsulant 14 has a thickness of 1.5 mm to 2 mm.

In some embodiments, the encapsulant 14 has a thickness of 2 mm to 4 mm. In another embodiment, the encapsulant 14 has a thickness of 2 mm to 3.5 mm. In another embodiment, the encapsulant 14 has a thickness of 2 mm to 3 mm. In another embodiment, the encapsulant 14 has a thickness of 2 mm to 2.5 mm. In some embodiments, the encapsulant 14 has a thickness of 2.5 mm to 4 mm. In another embodiment, the encapsulant 14 has a thickness of 2.5 mm to 3.5 mm. In another embodiment, the encapsulant 14 has a thickness of 2.5 mm to 3 mm. In some embodiments, the encapsulant 14 has a thickness of 3 mm to 4 mm. In another embodiment, the encapsulant 14 has a thickness of 3 mm to 3.5 mm. In some embodiments, the encapsulant 14 has a thickness of 3.5 mm to 4 mm.

In some embodiments, the encapsulant 14 has a thickness of 0.5 mm. In some embodiments, the encapsulant 14 has a thickness of 0.6 mm. In some embodiments, the encapsulant 14 has a thickness of 0.7 mm. In some embodiments, the encapsulant 14 has a thickness of 0.8 mm. In some embodiments, the encapsulant 14 has a thickness of 0.9 mm. In some embodiments, the encapsulant 14 has a thickness of 1 mm. In some embodiments, the encapsulant 14 has a thickness of 1.5 mm. In some embodiments, the encapsulant 14 has a thickness of 2 mm. In some embodiments, the encapsulant 14 has a thickness of 2.5 mm. In some embodiments, the encapsulant 14 has a thickness of 3 mm. In some embodiments, the encapsulant 14 has a thickness of 3.5 mm. In some embodiments, the encapsulant 14 has a thickness of 4 mm.

In some embodiments, a first layer 14a of the encapsulant 14 has a thickness of 0.2 mm to 2 mm. In some embodiments, the first layer 14a of the encapsulant 14 has a thickness of 0.2 mm to 1.5 mm. In some embodiments, the first layer 14a of the encapsulant 14 has a thickness of 0.2 mm to 1 mm. In some embodiments, the first layer 14a of the encapsulant 14 has a thickness of 0.2 mm to 0.6 mm. In some embodiments, the first layer 14a of the encapsulant 14 has a thickness of 0.2 mm to 0.5 mm. In some embodiments, the first layer 14a of the encapsulant 14 has a thickness of 0.5 mm to 2 mm. In some embodiments, the first layer 14a of the encapsulant 14 has a thickness of 0.5 mm to 1.5 mm. In some embodiments, the first layer 14a of the encapsulant 14 has a thickness of 0.5 mm to 1 mm. In some embodiments, the first layer 14a of the encapsulant 14 has a thickness of 1 mm to 2 mm. In some embodiments, the first layer 14a of the encapsulant 14 has a thickness of 1 mm to 1.5 mm. In some embodiments, the first layer 14a of the encapsulant 14 has a thickness of 1.5 mm to 2 mm.

In some embodiments, the first layer 14a of the encapsulant 14 has a thickness of 0.2 mm. In some embodiments, the first layer 14a of the encapsulant 14 has a thickness of 0.3 mm. In some embodiments, the first layer 14a of the encapsulant 14 has a thickness of 0.4 mm. In some embodiments, the first layer 14a of the encapsulant 14 has a thickness of 0.45 mm. In some embodiments, the first layer 14a of the encapsulant 14 has a thickness of 0.5 mm. In some embodiments, the first layer 14a of the encapsulant 14 has a thickness of 0.6 mm. In some embodiments, the first layer 14a of the encapsulant 14 has a thickness of 1 mm. In some embodiments, the first layer 14a of the encapsulant 14 has a thickness of 1.5 mm. In some embodiments, the first layer 14a of the encapsulant 14 has a thickness of 2 mm. In some embodiments, the first layer 14a of the encapsulant 14 has a thickness of 2.5 mm. In some embodiments, the first layer 14a of the encapsulant 14 has a thickness of 3 mm. In some embodiments, the first layer 14a of the encapsulant 14 has a thickness of 3.5 mm. In some embodiments, the first layer 14a of the encapsulant 14 has a thickness of 4 mm.

In some embodiments, a second layer 14b of the encapsulant 14 has a thickness of 0.2 mm to 2 mm. In some embodiments, the second layer 14b of the encapsulant 14 has a thickness of 0.2 mm to 1.5 mm. In some embodiments, the second layer 14b of the encapsulant 14 has a thickness of 0.2 mm to 1 mm. In some embodiments, the second layer 14b of the encapsulant 14 has a thickness of 0.2 mm to 0.5 mm. In some embodiments, the second layer 14b of the encapsulant 14 has a thickness of 0.5 mm to 2 mm. In some embodiments, the second layer 14b of the encapsulant 14 has a thickness of 0.5 mm to 1.5 mm. In some embodiments, the second layer 14b of the encapsulant 14 has a thickness of 0.5 mm to 1 mm. In some embodiments, the second layer 14b of the encapsulant 14 has a thickness of 1 mm to 2 mm. In some embodiments, the second layer 14b of the encapsulant 14 has a thickness of 1 mm to 1.5 mm. In some embodiments, the second layer 14b of the encapsulant 14 has a thickness of 1.5 mm to 2 mm.

In some embodiments, the second layer 14b of the encapsulant 14 has a thickness of 0.2 mm. In some embodiments, the second layer 14b of the encapsulant 14 has a thickness of 0.3 mm. In some embodiments, the second layer 14b of the encapsulant 14 has a thickness of 0.4 mm. In some embodiments, the second layer 14b of the encapsulant 14 has a thickness of 0.45 mm. In some embodiments, the second layer 14b of the encapsulant 14 has a thickness of 0.5 mm. In some embodiments, the second layer 14b of the encapsulant 14 has a thickness of 1 mm. In some embodiments, the second layer 14b of the encapsulant 14 has a thickness of 1.5 mm. In some embodiments, the second layer 14b of the encapsulant 14 has a thickness of 2 mm. In some embodiments, the second layer 14b of the encapsulant 14 has a thickness of 2.5 mm. In some embodiments, the second layer 14b of the encapsulant 14 has a thickness of 3 mm. In some embodiments, the second layer 14b of the encapsulant 14 has a thickness of 3.5 mm. In some embodiments, the second layer 14b of the encapsulant 14 has a thickness of 4 mm.

In some embodiments, the thickness of the first layer 14a is equal to the thickness of the second layer 14b. In another embodiment, the thickness of the first layer 14a is different from the thickness of the second layer 14b.

In some embodiments, the encapsulant 14 may be made from polyolefins, ethyl vinyl acetates, ionomers, silicones, poly vinyl butyral, epoxies, polyurethanes, or combinations/hybrids thereof. In some embodiments, the encapsulant 14 is made from thermosetting polyolefin.

In some embodiments, the photovoltaic module 10 includes a first end 18, a second end 20 opposite the first end 18, a first surface 19 extending from the first end 18 to the second end 20, and a second surface 21 opposite the first surface 19 and extending from the first end 18 to the second end 20. In some embodiments, the first surface 19 is an upper, sun facing-side surface of the photovoltaic module 10, and the second surface 21 is a lower surface configured to face a roof deck on which the photovoltaic module 10 is installed on the roof deck. In some embodiments, the polymer layer 24 includes the first surface 19. In some embodiments, the first surface 19 is textured. In some embodiments, the first surface 19 is textured to impart an appearance of a traditional asphalt roofing shingle. In some embodiments, the first surface 19 is textured to impart an appearance of and aesthetically match a roofing shingle. In some embodiments, the first surface 19 is an embossed surface. In some embodiments, a pattern on the first surface 19 includes a plurality of indentations. In some embodiment, each of the plurality of indentations has a circular shape. In some embodiment, each of the plurality of indentations has a rectangular shape. In some embodiments, each of the plurality of indentations has a square shape. In some embodiments, each of the plurality of indentations has a triangular shape. In some embodiments, each of the plurality of indentations has an elliptical shape. In some embodiments, each of the plurality of indentations has an oval shape. In some embodiments, each of the plurality of indentations has a rhombus shape. In some embodiments, each of the plurality of indentations has a hexagonal shape. In some embodiments, each of the plurality of indentations includes a pentagonal shape. In some embodiments, each of the plurality of indentations has a polygonal shape. In some embodiments, each of the plurality of indentations has a non-polygonal shape. In some embodiments, each of the plurality of indentations has a geometric shape. In some embodiments, each of the plurality of indentations has a non-geometric shape. In some embodiments, the pattern on the first surface 19 includes a plurality of dimples. In some embodiments, the indentations are created by embossing a portion of the first surface 19. In some embodiments, the texture includes a surface roughness (Ra). In some embodiments, the surface roughness (Ra) is 1 micron to 200 microns. In some embodiments, the pattern on the first surface 19 includes a plurality of lines. In some embodiments, the pattern on the first surface 19 includes a plurality of grooves. In some embodiments, the pattern on the first surface 19 includes crosshatches.

In some embodiments, the at least one solar cell 12 includes a plurality of the solar cells 12. In some embodiments, the plurality of solar cells 12 includes two solar cells. In some embodiments, the plurality of solar cells 12 includes three solar cells. In some embodiments, the plurality of solar cells 12 includes four solar cells. In some embodiments, the plurality of solar cells 12 includes five solar cells. In some embodiments, the plurality of solar cells 12 includes six solar cells. In some embodiments, the plurality of solar cells 12 includes seven solar cells. In some embodiments, the plurality of solar cells 12 includes eight solar cells. In some embodiments, the plurality of solar cells 12 includes nine solar cells. In some embodiments, the plurality of solar cells 12 includes ten solar cells. In some embodiments, the plurality of solar cells 12 includes eleven solar cells. In some embodiments, the plurality of solar cells 12 includes twelve solar cells. In some embodiments, the plurality of solar cells 12 includes thirteen solar cells. In some embodiments, the plurality of solar cells 12 includes fourteen solar cells. In some embodiments, the plurality of solar cells 12 includes fifteen solar cells. In some embodiments, the plurality of solar cells 12 includes sixteen solar cells. In some embodiments, the plurality of solar cells 12 includes more than sixteen solar cells.

In some embodiments, the plurality of solar cells 12 is arranged in one row (i.e., one reveal). In another embodiment, the plurality of solar cells 12 is arranged in two rows (i.e., two reveals). In another embodiment, the plurality of solar cells 12 is arranged in three rows (i.e., three reveals). In another embodiment, the plurality of solar cells 12 is arranged in four rows (i.e., four reveals). In another embodiment, the plurality of solar cells 12 is arranged in five rows (i.e., five reveals). In another embodiment, the plurality of solar cells 12 is arranged in six rows (i.e., six reveals). In other embodiments, the plurality of solar cells 12 is arranged in more than six rows. In some embodiments, the at least one solar cell 12 is electrically inactive (i.e., a "dummy" solar cell). In some embodiments, the photovoltaic module 10 does not include the at least one solar cell 12.

In some embodiments, the frontsheet 16 includes a glass layer 22 and a polymer layer 24 attached to a first surface of the glass layer 22. In some embodiments, the frontsheet 16 is juxtaposed with the first layer 14*a* of the encapsulant 14. In some embodiments, each of the encapsulant 14, the glass layer 22, and the polymer layer 24 is transparent. In some embodiments, the polymer layer 24 is attached to the glass layer 22 by an first adhesive layer 26. In some embodiments, the first adhesive layer 26 may include polyvinyl butyrate, acrylic, silicone, or polycarbonate. In another embodiment, the first adhesive layer 26 may include pressure sensitive adhesives. In another embodiment, the polymer layer 24 is attached to the glass layer 22 by thermal bonding. In another embodiment, the frontsheet 16 includes at least one of the glass layer 22 or the polymer layer 24. In some embodiments, the first adhesive layer 26 is transparent. As used herein, the term "transparent" means having a solar weighted transmittance of 80% or greater, and with respect to certain embodiments of the photovoltaic module 10, a transparent layer of the photovoltaic module has a solar weighted transmittance of 80% or greater. In another embodiment, the frontsheet 16 does not include the glass layer 22.

In some embodiments, the glass layer 22 has a thickness of 1 mm to 4 mm. In some embodiments, the glass layer 22 has a thickness of 1 mm to 3.5 mm. In some embodiments, the glass layer 22 has a thickness of 1 mm to 3 mm. In some embodiments, the glass layer 22 has a thickness of 1 mm to 2.5 mm. In some embodiments, the glass layer 22 has a thickness of 1 mm to 2 mm. In some embodiments, the glass layer 22 has a thickness of 1 mm to 1.5 mm. In some embodiments, the glass layer 22 has a thickness of 1.5 mm to 4 mm. In some embodiments, the glass layer 22 has a thickness of 1.5 mm to 3.5 mm. In some embodiments, the glass layer 22 has a thickness of 1.5 mm to 3 mm. In some embodiments, the glass layer 22 has a thickness of 1 mm to 2.5 mm. In some embodiments, the glass layer 22 has a thickness of 1.5 mm to 2 mm.

In some embodiments, the glass layer 22 has a thickness of 2 mm to 4 mm. In some embodiments, the glass layer 22 has a thickness of 2 mm to 3.5 mm. In some embodiments, the glass layer 22 has a thickness of 2 mm to 3 mm. In some embodiments, the glass layer 22 has a thickness of 2 mm to 2.5 mm. In some embodiments, the glass layer 22 has a thickness of 2.5 mm to 4 mm. In some embodiments, the glass layer 22 has a thickness of 2.5 mm to 3.5 mm. In some embodiments, the glass layer 22 has a thickness of 2.5 mm to 3 mm. In some embodiments, the glass layer 22 has a thickness of 3 mm to 4 mm. In some embodiments, the glass layer 22 has a thickness of 3 mm to 3.5 mm. In some embodiments, the glass layer 22 has a thickness of 3.5 mm to 4 mm.

In some embodiments, the glass layer 22 has a thickness of 1 mm. In some embodiments, the glass layer 22 has a thickness of 1.5 mm. In some embodiments, the glass layer 22 has a thickness of 2 mm. In some embodiments, the glass layer 22 has a thickness of 2.5 mm. In some embodiments, the glass layer 22 has a thickness of 3 mm. In some embodiments, the glass layer 22 has a thickness of 3.5 mm. In some embodiments, the glass layer 22 has a thickness of 4 mm.

In some embodiments, the first adhesive layer 26 is composed of thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof.

In some embodiments, the first adhesive layer 26 has a thickness of 0.2 mm to 2 mm. In some embodiments, the first adhesive layer 26 has a thickness of 0.2 mm to 1.5 mm. In some embodiments, the first adhesive layer 26 has a thickness of 0.2 mm to 1 mm. In some embodiments, the first adhesive layer 26 has a thickness of 0.2 mm to 0.5 mm. In some embodiments, the first adhesive layer 26 has a thickness of 0.5 mm to 2 mm. In some embodiments, the first adhesive layer 26 has a thickness of 0.5 mm to 1.5 mm. In some embodiments, the first adhesive layer 26 has a thickness of 0.5 mm to 1 mm. In some embodiments, the first adhesive layer 26 has a thickness of 1 mm to 2 mm. In some embodiments, the first adhesive layer 26 has a thickness of 1 mm to 1.5 mm. In some embodiments, the first adhesive layer 26 has a thickness of 1.5 mm to 2 mm.

In some embodiments, the first adhesive layer 26 has a thickness of 0.2 mm. In some embodiments, the first adhesive layer 26 has a thickness of 0.3 mm. In some embodiments, the first adhesive layer 26 has a thickness of 0.4 mm. In some embodiments, the first adhesive layer 26 has a thickness of 0.45 mm. In some embodiments, the first adhesive layer 26 has a thickness of 0.5 mm. In some embodiments, the first adhesive layer 26 has a thickness of 1 mm. In some embodiments, the first adhesive layer 26 has a thickness of 1.5 mm. In some embodiments, the first adhesive layer 26 has a thickness of 2 mm. In some embodiments, the first adhesive layer 26 has a thickness of 2.5 mm. In some embodiments, the first adhesive layer 26 has a thickness of 3 mm. In some embodiments, the first adhesive layer 26 has a thickness of 3.5 mm. In some embodiments, the first adhesive layer 26 has a thickness of 4 mm.

In another embodiment, the first adhesive layer 26 has a thickness of 1 µm to 900 µm. In some embodiments, the first adhesive layer 26 has a thickness of 1 µm to 900 µm. In some embodiments, the first adhesive layer 26 has a thickness of 1 µm to 850 µm. In some embodiments, the first adhesive layer 26 has a thickness of 1 µm to 800 µm. In some embodiments, the first adhesive layer 26 has a thickness of 1 µm to 750 µm. In some embodiments, the first adhesive layer 26 has a thickness of 1 µm to 700 µm. In some embodiments, the first adhesive layer 26 has a thickness of 1 µm to 650 µm. In some embodiments, the first adhesive layer 26 has a thickness of 1 µm to 600 µm. In some embodiments, the first adhesive layer 26 has a thickness of 1 µm to 550 µm. In some embodiments, the first adhesive layer 26 has a thickness of 1 µm to 500 µm. In some embodiments, the first adhesive layer 26 has a thickness of 1 µm to 450 µm. In some embodiments, the first adhesive layer 26 has a thickness of 1 µm to 400 µm. In some embodiments, the first adhesive layer 26 has a thickness of 1 µm to 350 µm. In some embodiments, the first adhesive layer 26 has a thickness of 1 µm to 300 µm. In some embodiments, the first adhesive layer 26 has a thickness of 1 µm to 250 µm. In some embodiments, the first adhesive layer 26 has a thickness of 1 µm to 200 µm. In some embodiments, the first adhesive layer 26 has a thickness of 1 µm to 150 µm. In some embodiments, the first adhesive layer 26 has a thickness of 1 µm to 100 µm. In some embodiments, the first adhesive layer 26 has a thickness of 1 µm to 50 µm.

In some embodiments, the first adhesive layer 26 has a thickness of 50 µm to 900 µm. In some embodiments, the first adhesive layer 26 has a thickness of 50 µm to 850 µm. In some embodiments, the first adhesive layer 26 has a thickness of 50 µm to 800 µm. In some embodiments, the first adhesive layer 26 has a thickness of 50 µm to 750 µm. In some embodiments, the first adhesive layer 26 has a thickness of 50 µm to 700 µm. In some embodiments, the first adhesive layer 26 has a thickness of 50 µm to 650 µm. In some embodiments, the first adhesive layer 26 has a thickness of 50 µm to 600 µm. In some embodiments, the first adhesive layer 26 has a thickness of 50 µm to 550 µm. In some embodiments, the first adhesive layer 26 has a thickness of 50 µm to 500 µm. In some embodiments, the first adhesive layer 26 has a thickness of 50 µm to 450 µm. In some embodiments, the first adhesive layer 26 has a thickness of 50 µm to 400 µm. In some embodiments, the first adhesive layer 26 has a thickness of 50 µm to 350 µm. In some embodiments, the first adhesive layer 26 has a thickness of 50 µm to 300 µm. In some embodiments, the first adhesive layer 26 has a thickness of 50 µm to 250 µm. In some embodiments, the first adhesive layer 26 has a thickness of 50 µm to 200 µm. In some embodiments, the first adhesive layer 26 has a thickness of 50 µm to 150 µm. In some embodiments, the first adhesive layer 26 has a thickness of 50 µm to 100 µm.

In some embodiments, the first adhesive layer 26 has a thickness of 100 µm to 900 µm. In some embodiments, the first adhesive layer 26 has a thickness of 100 µm to 850 µm. In some embodiments, the first adhesive layer 26 has a thickness of 100 µm to 800 µm. In some embodiments, the first adhesive layer 26 has a thickness of 100 µm to 750 µm. In some embodiments, the first adhesive layer 26 has a thickness of 100 µm to 700 µm. In some embodiments, the first adhesive layer 26 has a thickness of 100 µm to 650 µm. In some embodiments, the first adhesive layer 26 has a thickness of 100 µm to 600 µm. In some embodiments, the first adhesive layer 26 has a thickness of 100 µm to 550 µm. In some embodiments, the first adhesive layer 26 has a thickness of 100 µm to 500 µm. In some embodiments, the first adhesive layer 26 has a thickness of 100 µm to 450 µm. In some embodiments, the first adhesive layer 26 has a thickness of 100 µm to 400 µm. In some embodiments, the first adhesive layer 26 has a thickness of 100 µm to 350 µm. In some embodiments, the first adhesive layer 26 has a thickness of 100 µm to 300 µm. In some embodiments, the first adhesive layer 26 has a thickness of 100 µm to 250 µm. In some embodiments, the first adhesive layer 26 has a thickness of 100 µm to 200 µm. In some embodiments, the first adhesive layer 26 has a thickness of 100 µm to 150 µm.

In some embodiments, the first adhesive layer 26 has a thickness of 150 µm to 900 µm. In some embodiments, the first adhesive layer 26 has a thickness of 150 µm to 850 µm. In some embodiments, the first adhesive layer 26 has a thickness of 150 µm to 800 µm. In some embodiments, the first adhesive layer 26 has a thickness of 150 µm to 750 µm. In some embodiments, the first adhesive layer 26 has a thickness of 150 µm to 700 µm. In some embodiments, the first adhesive layer 26 has a thickness of 150 µm to 650 µm. In some embodiments, the first adhesive layer 26 has a thickness of 150 µm to 600 µm. In some embodiments, the first adhesive layer 26 has a thickness of 150 µm to 550 µm. In some embodiments, the first adhesive layer 26 has a thickness of 150 µm to 500 µm. In some embodiments, the first adhesive layer 26 has a thickness of 150 μm to 450 μm. In some embodiments, the first adhesive layer 26 has a thickness of 150 μm to 400 μm. In some embodiments, the first adhesive layer 26 has a thickness of 150 μm to 350 μm. In some embodiments, the first adhesive layer 26 has a thickness of 150 μm to 300 μm. In some embodiments, the first adhesive layer 26 has a thickness of 150 μm to 250 μm. In some embodiments, the first adhesive layer 26 has a thickness of 150 μm to 200 μm.

In some embodiments, the first adhesive layer 26 has a thickness of 200 μm to 900 μm. In some embodiments, the first adhesive layer 26 has a thickness of 200 μm to 850 μm. In some embodiments, the first adhesive layer 26 has a thickness of 200 μm to 800 μm. In some embodiments, the first adhesive layer 26 has a thickness of 200 μm to 750 μm. In some embodiments, the first adhesive layer 26 has a thickness of 200 μm to 700 μm. In some embodiments, the first adhesive layer 26 has a thickness of 200 μm to 650 μm. In some embodiments, the first adhesive layer 26 has a thickness of 200 μm to 600 μm. In some embodiments, the first adhesive layer 26 has a thickness of 200 μm to 550 μm. In some embodiments, the first adhesive layer 26 has a thickness of 200 μm to 500 μm. In some embodiments, the first adhesive layer 26 has a thickness of 200 μm to 450 μm. In some embodiments, the first adhesive layer 26 has a thickness of 200 μm to 400 μm. In some embodiments, the first adhesive layer 26 has a thickness of 200 μm to 350 μm. In some embodiments, the first adhesive layer 26 has a thickness of 200 μm to 300 μm. In some embodiments, the first adhesive layer 26 has a thickness of 200 μm to 250 μm.

In some embodiments, the first adhesive layer 26 has a thickness of 250 μm to 900 μm. In some embodiments, the first adhesive layer 26 has a thickness of 250 μm to 850 μm. In some embodiments, the first adhesive layer 26 has a thickness of 250 μm to 800 μm. In some embodiments, the first adhesive layer 26 has a thickness of 250 μm to 750 μm. In some embodiments, the first adhesive layer 26 has a thickness of 250 μm to 700 μm. In some embodiments, the first adhesive layer 26 has a thickness of 250 μm to 650 μm. In some embodiments, the first adhesive layer 26 has a thickness of 250 μm to 600 μm. In some embodiments, the first adhesive layer 26 has a thickness of 250 μm to 550 μm. In some embodiments, the first adhesive layer 26 has a thickness of 250 μm to 500 μm. In some embodiments, the first adhesive layer 26 has a thickness of 250 μm to 450 μm. In some embodiments, the first adhesive layer 26 has a thickness of 250 μm to 400 μm. In some embodiments, the first adhesive layer 26 has a thickness of 250 μm to 350 μm. In some embodiments, the first adhesive layer 26 has a thickness of 250 μm to 300 μm.

In some embodiments, the first adhesive layer 26 has a thickness of 300 μm to 900 μm. In some embodiments, the first adhesive layer 26 has a thickness of 300 μm to 850 μm. In some embodiments, the first adhesive layer 26 has a thickness of 300 μm to 800 μm. In some embodiments, the first adhesive layer 26 has a thickness of 300 μm to 750 μm. In some embodiments, the first adhesive layer 26 has a thickness of 300 μm to 700 μm. In some embodiments, the first adhesive layer 26 has a thickness of 300 μm to 650 μm. In some embodiments, the first adhesive layer 26 has a thickness of 300 μm to 600 μm. In some embodiments, the first adhesive layer 26 has a thickness of 300 μm to 550 μm. In some embodiments, the first adhesive layer 26 has a thickness of 300 μm to 500 μm. In some embodiments, the first adhesive layer 26 has a thickness of 300 μm to 450 μm. In some embodiments, the first adhesive layer 26 has a thickness of 300 μm to 400 μm. In some embodiments, the first adhesive layer 26 has a thickness of 300 μm to 350 μm.

In some embodiments, the first adhesive layer 26 has a thickness of 350 μm to 900 μm. In some embodiments, the first adhesive layer 26 has a thickness of 350 μm to 850 μm. In some embodiments, the first adhesive layer 26 has a thickness of 350 μm to 800 μm. In some embodiments, the first adhesive layer 26 has a thickness of 350 μm to 750 μm. In some embodiments, the first adhesive layer 26 has a thickness of 350 μm to 700 μm. In some embodiments, the first adhesive layer 26 has a thickness of 350 μm to 650 μm. In some embodiments, the first adhesive layer 26 has a thickness of 350 μm to 600 μm. In some embodiments, the first adhesive layer 26 has a thickness of 350 μm to 550 μm. In some embodiments, the first adhesive layer 26 has a thickness of 350 μm to 500 μm. In some embodiments, the first adhesive layer 26 has a thickness of 350 μm to 450 μm. In some embodiments, the first adhesive layer 26 has a thickness of 350 μm to 400 μm.

In some embodiments, the first adhesive layer 26 has a thickness of 400 μm to 900 μm. In some embodiments, the first adhesive layer 26 has a thickness of 400 μm to 850 μm. In some embodiments, the first adhesive layer 26 has a thickness of 400 μm to 800 μm. In some embodiments, the first adhesive layer 26 has a thickness of 400 μm to 750 μm. In some embodiments, the first adhesive layer 26 has a thickness of 400 μm to 700 μm. In some embodiments, the first adhesive layer 26 has a thickness of 400 μm to 650 μm. In some embodiments, the first adhesive layer 26 has a thickness of 400 μm to 600 μm. In some embodiments, the first adhesive layer 26 has a thickness of 400 μm to 550 μm. In some embodiments, the first adhesive layer 26 has a thickness of 400 μm to 500 μm. In some embodiments, the first adhesive layer 26 has a thickness of 400 μm to 450 μm.

In some embodiments, the first adhesive layer 26 has a thickness of 450 μm to 900 μm. In some embodiments, the first adhesive layer 26 has a thickness of 450 μm to 850 μm. In some embodiments, the first adhesive layer 26 has a thickness of 450 μm to 800 μm. In some embodiments, the first adhesive layer 26 has a thickness of 450 μm to 750 μm. In some embodiments, the first adhesive layer 26 has a thickness of 450 μm to 700 μm. In some embodiments, the first adhesive layer 26 has a thickness of 450 μm to 650 μm. In some embodiments, the first adhesive layer 26 has a thickness of 450 μm to 600 μm. In some embodiments, the first adhesive layer 26 has a thickness of 450 μm to 550 μm. In some embodiments, the first adhesive layer 26 has a thickness of 450 μm to 500 μm.

In some embodiments, the first adhesive layer 26 has a thickness of 500 μm to 900 μm. In some embodiments, the first adhesive layer 26 has a thickness of 500 μm to 850 μm. In some embodiments, the first adhesive layer 26 has a thickness of 500 μm to 800 μm. In some embodiments, the first adhesive layer 26 has a thickness of 500 μm to 750 μm. In some embodiments, the first adhesive layer 26 has a thickness of 500 μm to 700 μm. In some embodiments, the first adhesive layer 26 has a thickness of 500 μm to 650 μm. In some embodiments, the first adhesive layer 26 has a thickness of 500 μm to 600 μm. In some embodiments, the first adhesive layer 26 has a thickness of 500 μm to 550 μm.

In some embodiments, the first adhesive layer 26 has a thickness of 550 μm to 900 μm. In some embodiments, the first adhesive layer 26 has a thickness of 550 μm to 850 μm. In some embodiments, the first adhesive layer 26 has a thickness of 550 μm to 800 μm. In some embodiments, the first adhesive layer 26 has a thickness of 550 μm to 750 μm. In some embodiments, the first adhesive layer 26 has a thickness of 550 µm to 700 µm. In some embodiments, the first adhesive layer 26 has a thickness of 550 µm to 650 µm. In some embodiments, the first adhesive layer 26 has a thickness of 550 µm to 600 µm.

In some embodiments, the first adhesive layer 26 has a thickness of 600 µm to 900 µm. In some embodiments, the first adhesive layer 26 has a thickness of 600 µm to 850 µm. In some embodiments, the first adhesive layer 26 has a thickness of 600 µm to 800 µm. In some embodiments, the first adhesive layer 26 has a thickness of 600 µm to 750 µm. In some embodiments, the first adhesive layer 26 has a thickness of 600 µm to 700 µm. In some embodiments, the first adhesive layer 26 has a thickness of 600 µm to 650 µm.

In some embodiments, the first adhesive layer 26 has a thickness of 650 µm to 900 µm. In some embodiments, the first adhesive layer 26 has a thickness of 650 µm to 850 µm. In some embodiments, the first adhesive layer 26 has a thickness of 650 µm to 800 µm. In some embodiments, the first adhesive layer 26 has a thickness of 650 µm to 750 µm. In some embodiments, the first adhesive layer 26 has a thickness of 650 µm to 700 µm. In some embodiments, the first adhesive layer 26 has a thickness of 700 µm to 900 µm. In some embodiments, the first adhesive layer 26 has a thickness of 700 µm to 850 µm. In some embodiments, the first adhesive layer 26 has a thickness of 700 µm to 800 µm. In some embodiments, the first adhesive layer 26 has a thickness of 700 µm to 750 µm. In some embodiments, the first adhesive layer 26 has a thickness of 750 µm to 900 µm. In some embodiments, the first adhesive layer 26 has a thickness of 750 µm to 850 µm. In some embodiments, the first adhesive layer 26 has a thickness of 750 µm to 800 µm. In some embodiments, the first adhesive layer 26 has a thickness of 800 µm to 900 µm. In some embodiments, the first adhesive layer 26 has a thickness of 800 µm to 850 µm. In some embodiments, the first adhesive layer 26 has a thickness of 850 µm to 900 µm.

In some embodiments, the first adhesive layer 26 has a thickness of 1 µm. In some embodiments, the first adhesive layer 26 has a thickness of 50 µm. In some embodiments, the first adhesive layer 26 has a thickness of 100 µm. In some embodiments, the first adhesive layer 26 has a thickness of 1 µm. In some embodiments, the first adhesive layer 26 has a thickness of 150 µm. In some embodiments, the first adhesive layer 26 has a thickness of 200 µm. In some embodiments, the first adhesive layer 26 has a thickness of 250 µm. In some embodiments, the first adhesive layer 26 has a thickness of 300 µm. In some embodiments, the first adhesive layer 26 has a thickness of 350 µm. In some embodiments, the first adhesive layer 26 has a thickness of 400 µm. In some embodiments, the first adhesive layer 26 has a thickness of 450 µm. In some embodiments, the first adhesive layer 26 has a thickness of 500 µm. In some embodiments, the first adhesive layer 26 has a thickness of 550 µm. In some embodiments, the first adhesive layer 26 has a thickness of 600 µm. In some embodiments, the first adhesive layer 26 has a thickness of 650 µm. In some embodiments, the first adhesive layer 26 has a thickness of 700 µm. In some embodiments, the first adhesive layer 26 has a thickness of 750 µm. In some embodiments, the first adhesive layer 26 has a thickness of 800 µm. In some embodiments, the first adhesive layer 26 has a thickness of 850 µm. In some embodiments, the first adhesive layer 26 has a thickness of 900 µm.

In some embodiments, the polymer layer 24 is composed of a fluoropolymer. In certain embodiments, the fluoropolymer may be ethylene tetrafluoroethylene (ETFE), fluoropolymer is polyvinylidene fluoride (PVDF), tetrafluoroethylene-hexafluoropropylene copolymers (FEP), and tetrafluoroethylene-hexafluoropropylene-vinylidene fluoride copolymers (THV), polyvinyl fluoride (PVF), or blends thereof. In some embodiments, the frontsheet is composed of fluoropolymers, acrylics, polyesters, silicones, polycarbonates, or combinations thereof. In other embodiments, the polymer layer 24 is composed of polyethylene terephthalate (PET), polyethylene naphthalate (PEN), polyetheretherketone (PEEK), polyaryletherketone (PAEK), polyarylate (PAR), polyetherimide (PEI), polyarylsulfone (PAS), polyethersulfone (PES), polyamideimide (PAI), polyphenylsulfone (PPSU), polyolefin, cyclic olefin copolymers (CPCs), or polyimide. In some embodiments, the polymer layer 24 is composed of a crosslinked polymeric material. In some embodiments, 50% to 99% of the polymer chains of the polymeric material are crosslinked.

In some embodiments, the polymer layer 24 has a thickness of 0.01 mm to 0.5 mm. In some embodiments, the polymer layer 24 has a thickness of 0.01 mm to 0.45 mm. In some embodiments, the polymer layer 24 has a thickness of 0.01 mm to 0.4 mm. In some embodiments, the polymer layer 24 has a thickness of 0.01 mm to 0.35 mm. In some embodiments, the polymer layer 24 has a thickness of 0.01 mm to 0.3 mm. In some embodiments, the polymer layer 24 has a thickness of 0.01 mm to 0.25 mm. In some embodiments, the polymer layer 24 has a thickness of 0.01 mm to 0.2 mm. In some embodiments, the polymer layer 24 has a thickness of 0.01 mm to 0.15 mm. In some embodiments, the polymer layer 24 has a thickness of 0.01 mm to 0.1 mm. In some embodiments, the polymer layer 24 has a thickness of 0.01 mm to 0.05 mm.

In some embodiments, the polymer layer 24 has a thickness of 0.05 mm to 0.5 mm. In some embodiments, the polymer layer 24 has a thickness of 0.05 mm to 0.45 mm. In some embodiments, the polymer layer 24 has a thickness of 0.05 mm to 0.4 mm. In some embodiments, the polymer layer 24 has a thickness of 0.05 mm to 0.35 mm. In some embodiments, the polymer layer 24 has a thickness of 0.05 mm to 0.3 mm. In some embodiments, the polymer layer 24 has a thickness of 0.05 mm to 0.25 mm. In some embodiments, the polymer layer 24 has a thickness of 0.05 mm to 0.2 mm. In some embodiments, the polymer layer 24 has a thickness of 0.05 mm to 0.15 mm. In some embodiments, the polymer layer 24 has a thickness of 0.05 mm to 0.1 mm.

In some embodiments, the polymer layer 24 has a thickness of 0.1 mm to 0.5 mm. In some embodiments, the polymer layer 24 has a thickness of 0.1 mm to 0.45 mm. In some embodiments, the polymer layer 24 has a thickness of 0.1 mm to 0.4 mm. In some embodiments, the polymer layer 24 has a thickness of 0.1 mm to 0.35 mm. In some embodiments, the polymer layer 24 has a thickness of 0.1 mm to 0.3 mm. In some embodiments, the polymer layer 24 has a thickness of 0.1 mm to 0.25 mm. In some embodiments, the polymer layer 24 has a thickness of 0.1 mm to 0.2 mm. In some embodiments, the polymer layer 24 has a thickness of 0.1 mm to 0.15 mm. In some embodiments, the polymer layer 24 has a thickness of 0.15 mm to 0.5 mm. In some embodiments, the polymer layer 24 has a thickness of 0.15 mm to 0.45 mm. In some embodiments, the polymer layer 24 has a thickness of 0.15 mm to 0.4 mm. In some embodiments, the polymer layer 24 has a thickness of 0.15 mm to 0.35 mm. In some embodiments, the polymer layer 24 has a thickness of 0.15 mm to 0.3 mm. In some embodiments, the polymer layer 24 has a thickness of 0.15 mm to 0.25 mm. In some embodiments, the polymer layer 24 has a thickness of 0.15 mm to 0.2 mm.

In some embodiments, the polymer layer 24 has a thickness of 0.2 mm to 0.5 mm. In some embodiments, the polymer layer 24 has a thickness of 0.2 mm to 0.45 mm. In some embodiments, the polymer layer 24 has a thickness of 0.2 mm to 0.4 mm. In some embodiments, the polymer layer 24 has a thickness of 0.2 mm to 0.35 mm. In some embodiments, the polymer layer 24 has a thickness of 0.2 mm to 0.3 mm. In some embodiments, the polymer layer 24 has a thickness of 0.2 mm to 0.25 mm. In some embodiments, the polymer layer 24 has a thickness of 0.25 mm to 0.5 mm. In some embodiments, the polymer layer 24 has a thickness of 0.25 mm to 0.45 mm. In some embodiments, the polymer layer 24 has a thickness of 0.25 mm to 0.4 mm. In some embodiments, the polymer layer 24 has a thickness of 0.25 mm to 0.35 mm. In some embodiments, the polymer layer 24 has a thickness of 0.25 mm to 0.3 mm.

In some embodiments, the polymer layer 24 has a thickness of 0.3 mm to 0.5 mm. In some embodiments, the polymer layer 24 has a thickness of 0.3 mm to 0.45 mm. In some embodiments, the polymer layer 24 has a thickness of 0.3 mm to 0.4 mm. In some embodiments, the polymer layer 24 has a thickness of 0.3 mm to 0.35 mm. In some embodiments, the polymer layer 24 has a thickness of 0.35 mm to 0.5 mm. In some embodiments, the polymer layer 24 has a thickness of 0.35 mm to 0.45 mm. In some embodiments, the polymer layer 24 has a thickness of 0.35 mm to 0.4 mm. In some embodiments, the polymer layer 24 has a thickness of 0.4 mm to 0.5 mm. In some embodiments, the polymer layer 24 has a thickness of 0.4 mm to 0.45 mm. In some embodiments, the polymer layer 24 has a thickness of 0.45 mm to 0.5 mm.

In some embodiments, the polymer layer 24 has a thickness of 0.01 mm. In some embodiments, the polymer layer 24 has a thickness of 0.05 mm. In some embodiments, the polymer layer 24 has a thickness of 0.1 mm. In some embodiments, the polymer layer 24 has a thickness of 0.15 mm. In some embodiments, the polymer layer 24 has a thickness of 0.2 mm. In some embodiments, the polymer layer 24 has a thickness of 0.25 mm. In some embodiments, the polymer layer 24 has a thickness of 0.3 mm. In some embodiments, the polymer layer 24 has a thickness of 0.35 mm. In some embodiments, the polymer layer 24 has a thickness of 0.4 mm. In some embodiments, the polymer layer 24 has a thickness of 0.45 mm. In some embodiments, the polymer layer 24 has a thickness of 0.5 mm.

In some embodiments, a backsheet 28 is juxtaposed with a second layer 14b of the encapsulant 14. In some embodiments, the backsheet 28 includes a first layer 30. In some embodiments, the backsheet 28 includes a second layer 32. In some embodiments, the first layer 30 is juxtaposed with the second layer 14b of the encapsulant 14. In some embodiments, the second layer 32 is juxtaposed with the first layer 30. In some embodiments, the backsheet 28 only includes the first layer 30 (see FIG. 3). In some embodiments, the backsheet 28 includes a scrim. In some embodiments, the scrim is located between the first layer 30 and the second layer 32.

In some embodiments, the first layer 30 of the backsheet 28 is composed of a polymeric material. In some embodiments, the first layer 30 of the backsheet 28 is composed of polyethylene terephthalate ("PET"). In another embodiment, the first layer 30 of the backsheet 28 is composed of ethylene tetrafluoroethylene ("ETFE"). In some embodiments, the first layer 30 of the backsheet 28 is composed of an acrylic such as polymethyl methacrylate ("PMMA"). In some embodiments, the first layer 30 of the backsheet 28 is composed of thermoplastic polyolefin (TPO). In some embodiments, the first layer 30 of the backsheet 28 includes of a single ply TPO roofing membrane. In other embodiments, non-limiting examples of TPO membranes are disclosed in U.S. Pat. No. 9,359,014 to Yang et al., which is incorporated by reference herein in its entirety. In another embodiment, the first layer 30 of the backsheet 28 is composed of polyvinyl chloride. In some embodiments, the first layer 30 of the backsheet 28 is composed of ethylene propylene diene monomer (EPDM) rubber. In some embodiments, the first layer 30 of the backsheet 28 includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the first layer 30 is white in color. In some embodiments, the first layer 30 is white TPO.

In some embodiments, the first layer 30 has a thickness of 0.2 mm to 0.5 mm. In another embodiment, the first layer 30 has a thickness of 0.2 mm to 0.4 mm. In another embodiment, the first layer 30 has a thickness of 0.2 mm to 0.3 mm. In some embodiments, the first layer 30 has a thickness of 0.3 mm to 0.5 mm. In another embodiment, the first layer 30 has a thickness of 0.3 mm to 0.4 mm. In some embodiments, the first layer 30 has a thickness of 0.4 mm to 0.5 mm. In some embodiments, the first layer 30 has a thickness of 0.2 mm. In some embodiments, the first layer 30 has a thickness of 0.3 mm. In some embodiments, the first layer 30 has a thickness of 0.4 mm. In some embodiments, the first layer 30 has a thickness of 0.5 mm.

In some embodiments, the second layer 32 of the backsheet 28 is composed of a polymeric material. In some embodiments, the second layer 32 of the backsheet 28 is composed of thermoplastic polyolefin (TPO). In some embodiments, the second layer 32 of the backsheet 28 includes a single ply TPO roofing membrane. In other embodiments, non-limiting examples of TPO membranes are disclosed in U.S. Pat. No. 9,359,014 to Yang et al., which is incorporated by reference herein in its entirety. In another embodiment, the second layer 32 of the backsheet 28 is composed of polyethylene terephthalate ("PET"). In another embodiment, the second layer 32 is composed of styrene acrylic copolymer. In another embodiment, the second layer 32 of the backsheet 28 is composed of ethylene tetrafluoroethylene ("ETFE"). In some embodiments, the second layer 32 of the backsheet 28 is composed of an acrylic such as polymethyl methacrylate ("PMMA"). In another embodiment, the second layer 32 of the backsheet 28 is composed of polyvinyl chloride. In some embodiments, the second layer 32 of the backsheet 28 is composed of ethylene propylene diene monomer (EPDM) rubber. In some embodiments, the second layer 32 of the backsheet 28 includes a flame retardant additive. In some embodiments, the flame retardant additive may be clays, nanoclays, silicas, carbon black, metal hydroxides such as aluminum hydroxide, metal foils, graphite, and combinations thereof. In some embodiments, the second layer 32 is white in color. In some embodiments, the second layer 32 is white TPO.

In some embodiments, the second layer 32 has a thickness of 1 mm to 5 mm. In some embodiments, the second layer 32 has a thickness of 1 mm to 4 mm. In some embodiments, the second layer 32 has a thickness of 1 mm to 3 mm. In some embodiments, the second layer 32 has a thickness of 1 mm to 2 mm. In some embodiments, the second layer 32 has a thickness of 2 mm to 5 mm. In some embodiments, the second layer 32 has a thickness of 2 mm to 4 mm. In some embodiments, the second layer 32 has a thickness of 2 mm to 3 mm. In some embodiments, the second layer 32 has a thickness of 3 mm to 5 mm. In some embodiments, the second layer 32 has a thickness of 3 mm to 4 mm. In some embodiments, the second layer 32 has a thickness of 4 mm to 5 mm. In some embodiments, the second layer 32 has a thickness of 1 mm. In some embodiments, the second layer 32 has a thickness of 2 mm. In some embodiments, the second layer 32 has a thickness of 3 mm. In some embodiments, the second layer 32 has a thickness of 4 mm. In some embodiments, the second layer 32 has a thickness of 5 mm.

In some embodiments, the first layer 30 is attached to the second layer 32 by a second adhesive layer 34. In some embodiments, the second adhesive layer 34 may include polyvinyl butyrate, acrylic, silicone, or polycarbonate. In another embodiment, the second adhesive layer 34 may include pressure sensitive adhesives.

In some embodiments, the second adhesive layer 34 is composed of thermosetting polyolefin, thermosetting polyolefin encapsulant material, thermosetting ethylene-vinyl acetate (EVA), EVA encapsulants, thermoplastic olefin, thermoplastic polyolefin (TPO) or hybrids/combinations thereof.

In some embodiments, the second adhesive layer 34 has a thickness of 0.2 mm to 2 mm. In some embodiments, the second adhesive layer 34 has a thickness of 0.2 mm to 1.5 mm. In some embodiments, the second adhesive layer 34 has a thickness of 0.2 mm to 1 mm. In some embodiments, the second adhesive layer 34 has a thickness of 0.2 mm to 0.5 mm. In some embodiments, the second adhesive layer 34 has a thickness of 0.5 mm to 2 mm. In some embodiments, the second adhesive layer 34 has a thickness of 0.5 mm to 1.5 mm. In some embodiments, the second adhesive layer 34 has a thickness of 0.5 mm to 1 mm. In some embodiments, the second adhesive layer 34 has a thickness of 1 mm to 2 mm. In some embodiments, the second adhesive layer 34 has a thickness of 1 mm to 1.5 mm. In some embodiments, the second adhesive layer 34 has a thickness of 1.5 mm to 2 mm.

In some embodiments, the second adhesive layer 34 has a thickness of 0.2 mm. In some embodiments, the second adhesive layer 34 has a thickness of 0.3 mm. In some embodiments, the second adhesive layer 34 has a thickness of 0.4 mm. In some embodiments, the second adhesive layer 34 has a thickness of 0.45 mm. In some embodiments, the second adhesive layer 34 has a thickness of 0.5 mm. In some embodiments, the second adhesive layer 34 has a thickness of 1 mm. In some embodiments, the second adhesive layer 34 has a thickness of 1.5 mm. In some embodiments, the second adhesive layer 34 has a thickness of 2 mm. In some embodiments, the second adhesive layer 34 has a thickness of 2.5 mm. In some embodiments, the second adhesive layer 34 has a thickness of 3 mm. In some embodiments, the second adhesive layer 34 has a thickness of 3.5 mm. In some embodiments, the second adhesive layer 34 has a thickness of 4 mm.

In another embodiment, the second adhesive layer 34 has a thickness of 1 μm to 900 μm. In some embodiments, the second adhesive layer 34 has a thickness of 1 μm to 900 μm. In some embodiments, the second adhesive layer 34 has a thickness of 1 μm to 850 μm. In some embodiments, the second adhesive layer 34 has a thickness of 1 μm to 800 μm. In some embodiments, the second adhesive layer 34 has a thickness of 1 μm to 750 μm. In some embodiments, the second adhesive layer 34 has a thickness of 1 μm to 700 μm. In some embodiments, the second adhesive layer 34 has a thickness of 1 μm to 650 μm. In some embodiments, the second adhesive layer 34 has a thickness of 1 μm to 600 μm. In some embodiments, the second adhesive layer 34 has a thickness of 1 μm to 550 μm. In some embodiments, the second adhesive layer 34 has a thickness of 1 μm to 500 μm. In some embodiments, the second adhesive layer 34 has a thickness of 1 μm to 450 μm. In some embodiments, the second adhesive layer 34 has a thickness of 1 μm to 400 μm. In some embodiments, the second adhesive layer 34 has a thickness of 1 μm to 350 μm. In some embodiments, the second adhesive layer 34 has a thickness of 1 μm to 300 μm. In some embodiments, the second adhesive layer 34 has a thickness of 1 μm to 250 μm. In some embodiments, the second adhesive layer 34 has a thickness of 1 μm to 200 μm. In some embodiments, the second adhesive layer 34 has a thickness of 1 μm to 150 μm. In some embodiments, the second adhesive layer 34 has a thickness of 1 μm to 100 μm. In some embodiments, the second adhesive layer 34 has a thickness of 1 μm to 50 μm.

In some embodiments, the second adhesive layer 34 has a thickness of 50 μm to 900 μm. In some embodiments, the second adhesive layer 34 has a thickness of 50 μm to 850 μm. In some embodiments, the second adhesive layer 34 has a thickness of 50 μm to 800 μm. In some embodiments, the second adhesive layer 34 has a thickness of 50 μm to 750 μm. In some embodiments, the second adhesive layer 34 has a thickness of 50 μm to 700 μm. In some embodiments, the second adhesive layer 34 has a thickness of 50 μm to 650 μm. In some embodiments, the second adhesive layer 34 has a thickness of 50 μm to 600 μm. In some embodiments, the second adhesive layer 34 has a thickness of 50 μm to 550 μm. In some embodiments, the second adhesive layer 34 has a thickness of 50 μm to 500 μm. In some embodiments, the second adhesive layer 34 has a thickness of 50 μm to 450 μm. In some embodiments, the second adhesive layer 34 has a thickness of 50 μm to 400 μm. In some embodiments, the second adhesive layer 34 has a thickness of 50 μm to 350 μm. In some embodiments, the second adhesive layer 34 has a thickness of 50 μm to 300 μm. In some embodiments, the second adhesive layer 34 has a thickness of 50 μm to 250 μm. In some embodiments, the second adhesive layer 34 has a thickness of 50 μm to 200 μm. In some embodiments, the second adhesive layer 34 has a thickness of 50 μm to 150 μm. In some embodiments, the second adhesive layer 34 has a thickness of 50 μm to 100 μm.

In some embodiments, the second adhesive layer 34 has a thickness of 100 μm to 900 μm. In some embodiments, the second adhesive layer 34 has a thickness of 100 μm to 850 μm. In some embodiments, the second adhesive layer 34 has a thickness of 100 μm to 800 μm. In some embodiments, the second adhesive layer 34 has a thickness of 100 μm to 750 μm. In some embodiments, the second adhesive layer 34 has a thickness of 100 μm to 700 μm. In some embodiments, the second adhesive layer 34 has a thickness of 100 μm to 650 μm. In some embodiments, the second adhesive layer 34 has a thickness of 100 μm to 600 μm. In some embodiments, the second adhesive layer 34 has a thickness of 100 μm to 550 μm. In some embodiments, the second adhesive layer 34 has a thickness of 100 μm to 500 μm. In some embodiments, the second adhesive layer 34 has a thickness of 100 μm to 450 μm. In some embodiments, the second adhesive layer 34 has a thickness of 100 μm to 400 μm. In some embodiments, the second adhesive layer 34 has a thickness of 100 μm to 350 μm. In some embodiments, the second adhesive layer 34 has a thickness of 100 μm to 300 μm. In some embodiments, the second adhesive layer 34 has a thickness of 100 μm to 250 μm. In some embodiments, the second adhesive layer 34 has a thickness of 100 μm to 200 μm. In some embodiments, the second adhesive layer 34 has a thickness of 100 μm to 150 μm.

In some embodiments, the second adhesive layer 34 has a thickness of 150 µm to 900 µm. In some embodiments, the second adhesive layer 34 has a thickness of 150 µm to 850 µm. In some embodiments, the second adhesive layer 34 has a thickness of 150 µm to 800 µm. In some embodiments, the second adhesive layer 34 has a thickness of 150 µm to 750 µm. In some embodiments, the second adhesive layer 34 has a thickness of 150 µm to 700 µm. In some embodiments, the second adhesive layer 34 has a thickness of 150 µm to 650 µm. In some embodiments, the second adhesive layer 34 has a thickness of 150 µm to 600 µm. In some embodiments, the second adhesive layer 34 has a thickness of 150 µm to 550 µm. In some embodiments, the second adhesive layer 34 has a thickness of 150 µm to 500 µm. In some embodiments, the second adhesive layer 34 has a thickness of 150 µm to 450 µm. In some embodiments, the second adhesive layer 34 has a thickness of 150 µm to 400 µm. In some embodiments, the second adhesive layer 34 has a thickness of 150 µm to 350 µm. In some embodiments, the second adhesive layer 34 has a thickness of 150 µm to 300 µm. In some embodiments, the second adhesive layer 34 has a thickness of 150 µm to 250 µm. In some embodiments, the second adhesive layer 34 has a thickness of 150 µm to 200 µm.

In some embodiments, the second adhesive layer 34 has a thickness of 200 µm to 900 µm. In some embodiments, the second adhesive layer 34 has a thickness of 200 µm to 850 µm. In some embodiments, the second adhesive layer 34 has a thickness of 200 µm to 800 µm. In some embodiments, the second adhesive layer 34 has a thickness of 200 µm to 750 µm. In some embodiments, the second adhesive layer 34 has a thickness of 200 µm to 700 µm. In some embodiments, the second adhesive layer 34 has a thickness of 200 µm to 650 µm. In some embodiments, the second adhesive layer 34 has a thickness of 200 µm to 600 µm. In some embodiments, the second adhesive layer 34 has a thickness of 200 µm to 550 µm. In some embodiments, the second adhesive layer 34 has a thickness of 200 µm to 500 µm. In some embodiments, the second adhesive layer 34 has a thickness of 200 µm to 450 µm. In some embodiments, the second adhesive layer 34 has a thickness of 200 µm to 400 µm. In some embodiments, the second adhesive layer 34 has a thickness of 200 µm to 350 µm. In some embodiments, the second adhesive layer 34 has a thickness of 200 µm to 300 µm. In some embodiments, the second adhesive layer 34 has a thickness of 200 µm to 250 µm.

In some embodiments, the second adhesive layer 34 has a thickness of 250 µm to 900 µm. In some embodiments, the second adhesive layer 34 has a thickness of 250 µm to 850 µm. In some embodiments, the second adhesive layer 34 has a thickness of 250 µm to 800 µm. In some embodiments, the second adhesive layer 34 has a thickness of 250 µm to 750 µm. In some embodiments, the second adhesive layer 34 has a thickness of 250 µm to 700 µm. In some embodiments, the second adhesive layer 34 has a thickness of 250 µm to 650 µm. In some embodiments, the second adhesive layer 34 has a thickness of 250 µm to 600 µm. In some embodiments, the second adhesive layer 34 has a thickness of 250 µm to 550 µm. In some embodiments, the second adhesive layer 34 has a thickness of 250 µm to 500 µm. In some embodiments, the second adhesive layer 34 has a thickness of 250 µm to 450 µm. In some embodiments, the second adhesive layer 34 has a thickness of 250 µm to 400 µm. In some embodiments, the second adhesive layer 34 has a thickness of 250 µm to 350 µm. In some embodiments, the second adhesive layer 34 has a thickness of 250 µm to 300 µm.

In some embodiments, the second adhesive layer 34 has a thickness of 300 µm to 900 µm. In some embodiments, the second adhesive layer 34 has a thickness of 300 µm to 850 µm. In some embodiments, the second adhesive layer 34 has a thickness of 300 µm to 800 µm. In some embodiments, the second adhesive layer 34 has a thickness of 300 µm to 750 µm. In some embodiments, the second adhesive layer 34 has a thickness of 300 µm to 700 µm. In some embodiments, the second adhesive layer 34 has a thickness of 300 µm to 650 µm. In some embodiments, the second adhesive layer 34 has a thickness of 300 µm to 600 µm. In some embodiments, the second adhesive layer 34 has a thickness of 300 µm to 550 µm. In some embodiments, the second adhesive layer 34 has a thickness of 300 µm to 500 µm. In some embodiments, the second adhesive layer 34 has a thickness of 300 µm to 450 µm. In some embodiments, the second adhesive layer 34 has a thickness of 300 µm to 400 µm. In some embodiments, the second adhesive layer 34 has a thickness of 300 µm to 350 µm.

In some embodiments, the second adhesive layer 34 has a thickness of 350 µm to 900 µm. In some embodiments, the second adhesive layer 34 has a thickness of 350 µm to 850 µm. In some embodiments, the second adhesive layer 34 has a thickness of 350 µm to 800 µm. In some embodiments, the second adhesive layer 34 has a thickness of 350 µm to 750 µm. In some embodiments, the second adhesive layer 34 has a thickness of 350 µm to 700 µm. In some embodiments, the second adhesive layer 34 has a thickness of 350 µm to 650 µm. In some embodiments, the second adhesive layer 34 has a thickness of 350 µm to 600 µm. In some embodiments, the second adhesive layer 34 has a thickness of 350 µm to 550 µm. In some embodiments, the second adhesive layer 34 has a thickness of 350 µm to 500 µm. In some embodiments, the second adhesive layer 34 has a thickness of 350 µm to 450 µm. In some embodiments, the second adhesive layer 34 has a thickness of 350 µm to 400 µm.

In some embodiments, the second adhesive layer 34 has a thickness of 400 µm to 900 µm. In some embodiments, the second adhesive layer 34 has a thickness of 400 µm to 850 µm. In some embodiments, the second adhesive layer 34 has a thickness of 400 µm to 800 µm. In some embodiments, the second adhesive layer 34 has a thickness of 400 µm to 750 µm. In some embodiments, the second adhesive layer 34 has a thickness of 400 µm to 700 µm. In some embodiments, the second adhesive layer 34 has a thickness of 400 µm to 650 µm. In some embodiments, the second adhesive layer 34 has a thickness of 400 µm to 600 µm. In some embodiments, the second adhesive layer 34 has a thickness of 400 µm to 550 µm. In some embodiments, the second adhesive layer 34 has a thickness of 400 µm to 500 µm. In some embodiments, the second adhesive layer 34 has a thickness of 400 µm to 450 µm.

In some embodiments, the second adhesive layer 34 has a thickness of 450 µm to 900 µm. In some embodiments, the second adhesive layer 34 has a thickness of 450 µm to 850 µm. In some embodiments, the second adhesive layer 34 has a thickness of 450 µm to 800 µm. In some embodiments, the second adhesive layer 34 has a thickness of 450 µm to 750 µm. In some embodiments, the second adhesive layer 34 has a thickness of 450 µm to 700 µm. In some embodiments, the second adhesive layer 34 has a thickness of 450 µm to 650 µm. In some embodiments, the second adhesive layer 34 has a thickness of 450 µm to 600 µm. In some embodiments, the second adhesive layer 34 has a thickness of 450 µm to 550 µm. In some embodiments, the second adhesive layer 34 has a thickness of 450 µm to 500 µm.

In some embodiments, the second adhesive layer 34 has a thickness of 500 µm to 900 µm. In some embodiments, the second adhesive layer 34 has a thickness of 500 µm to 850

µm. In some embodiments, the second adhesive layer 34 has a thickness of 500 µm to 800 µm. In some embodiments, the second adhesive layer 34 has a thickness of 500 µm to 750 µm. In some embodiments, the second adhesive layer 34 has a thickness of 500 µm to 700 µm. In some embodiments, the second adhesive layer 34 has a thickness of 500 µm to 650 µm. In some embodiments, the second adhesive layer 34 has a thickness of 500 µm to 600 µm. In some embodiments, the second adhesive layer 34 has a thickness of 500 µm to 550 µm.

In some embodiments, the second adhesive layer 34 has a thickness of 550 µm to 900 µm. In some embodiments, the second adhesive layer 34 has a thickness of 550 µm to 850 µm. In some embodiments, the second adhesive layer 34 has a thickness of 550 µm to 800 µm. In some embodiments, the second adhesive layer 34 has a thickness of 550 µm to 750 µm. In some embodiments, the second adhesive layer 34 has a thickness of 550 µm to 700 µm. In some embodiments, the second adhesive layer 34 has a thickness of 550 µm to 650 µm. In some embodiments, the second adhesive layer 34 has a thickness of 550 µm to 600 µm.

In some embodiments, the second adhesive layer 34 has a thickness of 600 µm to 900 µm. In some embodiments, the second adhesive layer 34 has a thickness of 600 µm to 850 µm. In some embodiments, the second adhesive layer 34 has a thickness of 600 µm to 800 µm. In some embodiments, the second adhesive layer 34 has a thickness of 600 µm to 750 µm. In some embodiments, the second adhesive layer 34 has a thickness of 600 µm to 700 µm. In some embodiments, the second adhesive layer 34 has a thickness of 600 µm to 650 µm.

In some embodiments, the second adhesive layer 34 has a thickness of 650 µm to 900 µm. In some embodiments, the second adhesive layer 34 has a thickness of 650 µm to 850 µm. In some embodiments, the second adhesive layer 34 has a thickness of 650 µm to 800 µm. In some embodiments, the second adhesive layer 34 has a thickness of 650 µm to 750 µm. In some embodiments, the second adhesive layer 34 has a thickness of 650 µm to 700 µm. In some embodiments, the second adhesive layer 34 has a thickness of 700 µm to 900 µm. In some embodiments, the second adhesive layer 34 has a thickness of 700 µm to 850 µm. In some embodiments, the second adhesive layer 34 has a thickness of 700 µm to 800 µm. In some embodiments, the second adhesive layer 34 has a thickness of 700 µm to 750 µm. In some embodiments, the second adhesive layer 34 has a thickness of 750 µm to 900 µm. In some embodiments, the second adhesive layer 34 has a thickness of 750 µm to 850 µm. In some embodiments, the second adhesive layer 34 has a thickness of 750 µm to 800 µm. In some embodiments, the second adhesive layer 34 has a thickness of 800 µm to 900 µm. In some embodiments, the second adhesive layer 34 has a thickness of 800 µm to 850 µm. In some embodiments, the second adhesive layer 34 has a thickness of 850 µm to 900 µm.

In some embodiments, the second adhesive layer 34 has a thickness of 1 µm. In some embodiments, the second adhesive layer 34 has a thickness of 50 µm. In some embodiments, the second adhesive layer 34 has a thickness of 100 µm. In some embodiments, the second adhesive layer 34 has a thickness of 1 µm. In some embodiments, the second adhesive layer 34 has a thickness of 150 µm. In some embodiments, the second adhesive layer 34 has a thickness of 200 µm. In some embodiments, the second adhesive layer 34 has a thickness of 250 µm. In some embodiments, the second adhesive layer 34 has a thickness of 300 µm. In some embodiments, the second adhesive layer 34 has a thickness of 350 µm. In some embodiments, the second adhesive layer 34 has a thickness of 400 µm. In some embodiments, the second adhesive layer 34 has a thickness of 450 µm. In some embodiments, the second adhesive layer 34 has a thickness of 500 µm. In some embodiments, the second adhesive layer 34 has a thickness of 550 µm. In some embodiments, the second adhesive layer 34 has a thickness of 600 µm. In some embodiments, the second adhesive layer 34 has a thickness of 650 µm. In some embodiments, the second adhesive layer 34 has a thickness of 700 µm. In some embodiments, the second adhesive layer 34 has a thickness of 750 µm. In some embodiments, the second adhesive layer 34 has a thickness of 800 µm. In some embodiments, the second adhesive layer 34 has a thickness of 850 µm. In some embodiments, the second adhesive layer 34 has a thickness of 900 µm.

In some embodiments, the first layer 30 and the second layer 32 are welded to one another. In some embodiments, the first layer 30 and the second layer 32 are ultrasonically welded to one another. In some embodiments, the first layer 30 and the second layer 32 are heat welded to one another. In some embodiments, the first layer 30 and the second layer 32 are thermally bonded to one another. In some embodiments, the first layer 30 and the second layer 32 are adhered to one another by an adhesive. In some embodiments, the first layer 30 and the second layer 32 are laminated. In some embodiments, the first layer 30 and the second layer 32 are co-extruded. In some embodiments, the first layer 30 and the second layer 32 are mechanically attached to one another.

In some embodiments, the first layer 30 includes a first edge 30a, a second edge 30b opposite the first edge 30a, a third edge 30c extending from the first edge 30a to the second edge 30b, and a fourth edge 30d opposite the third edge 30c and extending from the first edge 30a to the second edge 30b. In some embodiments, the second layer 32 includes a first edge 32a, a second edge 32b opposite the first edge 32a, a third edge 32c extending from the first edge 32a to the second edge 32b, and a fourth edge 32d opposite the third edge 32c and extending from the first edge 32a to the second edge 32b.

In some embodiments, the first edge 30a of the first layer 30 is offset from the first edge 32a of the second layer 32. In some embodiments, the second edge 30b of the first layer 30 is offset from the second edge 32b of the second layer 32. In some embodiments, the third edge 30c of the first layer 30 is offset from the third edge 32c of the second layer 32. In some embodiments, the fourth edge 30d of the first layer 30 is offset from the fourth edge 32d of the second layer 32.

In some embodiments, at least one of the first, second, third and fourth edges 30a, 30b, 30c, 30d of the first layer 30 is offset from the corresponding first, second, third and fourth edges 32a, 32b, 32c, 32d of the second layer 32. In some embodiments, at least two of the first, second, third and fourth edges 30a, 30b, 30c, 30d of the first layer 30 is offset from the corresponding first, second, third and fourth edges 32a, 32b, 32c, 32d of the second layer 32. In some embodiments, at least three of the first, second, third and fourth edges 30a, 30b, 30c, 30d of the first layer 30 is offset from the corresponding first, second, third and fourth edges 32a, 32b, 32c, 32d of the second layer 32. In some embodiments, each of the first, second, third and fourth edges 30a, 30b, 30c, 30d of the first layer 30 is offset from the corresponding first, second, third and fourth edges 32a, 32b, 32c, 32d of the second layer 32.

In some embodiments, at least one of the first, second, third and fourth edges 30a, 30b, 30c, 30d of the first layer 30 is offset from the corresponding first, second, third and fourth edges 32a, 32b, 32c, 32d of the second layer 32, while the remaining ones of the first, second, third and fourth edges 30a, 30b, 30c, 30d of the first layer 30 are not offset from the corresponding first, second, third and fourth edges 32a, 32b, 32c, 32d of the second layer 32. In some embodiments, at least two of the first, second, third and fourth edges 30a, 30b, 30c, 30d of the first layer 30 is offset from the corresponding first, second, third and fourth edges 32a, 32b, 32c, 32d of the second layer 32, while the remaining ones of the first, second, third and fourth edges 30a, 30b, 30c, 30d of the first layer 30 are not offset from the corresponding first, second, third and fourth edges 32a, 32b, 32c, 32d of the second layer 32. In some embodiments, at least three of the first, second, third and fourth edges 30a, 30b, 30c, 30d of the first layer 30 is offset from the corresponding first, second, third and fourth edges 32a, 32b, 32c, 32d of the second layer 32, while the remaining ones of the first, second, third and fourth edges 30a, 30b, 30c, 30d of the first layer 30 are not offset from the corresponding first, second, third and fourth edges 32a, 32b, 32c, 32d of the second layer 32.

Figure 4:
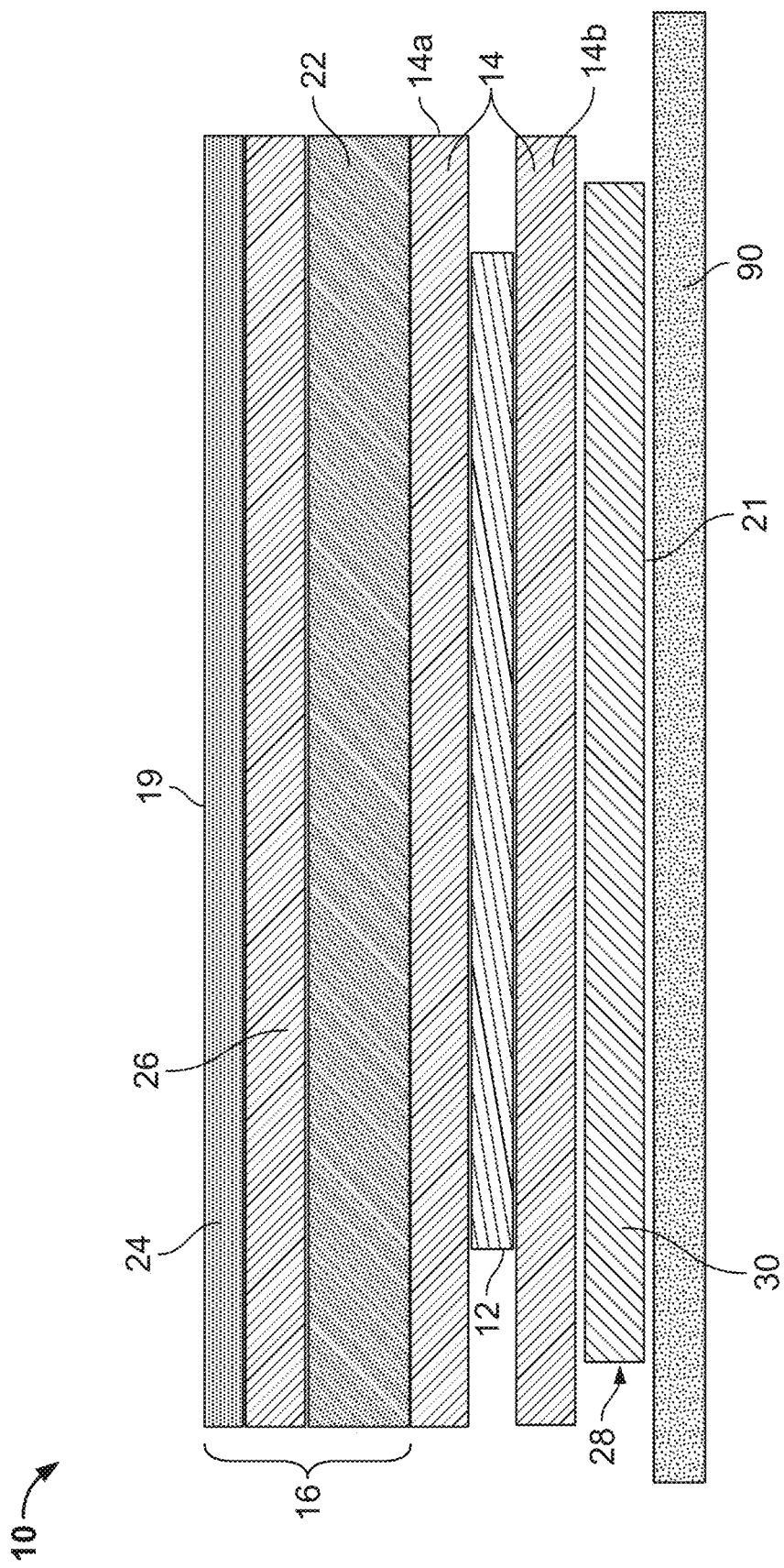

In some embodiments, the second layer 32 forms a lower surface of the photovoltaic module 10. In some embodiments, the first layer 30 forms a lower surface of the photovoltaic module 10 (see FIG. 4).

In some embodiments, the first layer 30 includes a first length L1 extending from the first edge 30a of the first layer 30 to the second edge of the first layer 30. In some embodiments, the second layer 32 includes a second length L2 extending from the first edge 32a of the second layer 32 to the second edge 32b of the second layer 32. Referring to FIG. 1, in some embodiments, the first length L1 is greater than the second length L2. Referring to FIG. 3, in some embodiments, the second length L2 is greater than the first length L1.

In some embodiments, the first layer 30 includes a first width W1 extending from the third edge 30c of the first layer 30 to the fourth edge 30d of the first layer 30. In some embodiments, the second layer 32 includes a second width W2 extending from the third edge 32c of the second layer 32 to the fourth edge 32d of the second layer 32. In some embodiments, the first width W1 is greater than the second width W2. In some embodiments, the second width W2 is greater than the first width W1.

Referring to FIG. 5, in some embodiments, the first edge 30a of the first layer 30 is offset from the first edge 32a of the second layer 32 by a first distance D1. In some embodiments, the second edge 30b of the first layer 30 is offset from the second edge 32b of the second layer by a second distance D2. In some embodiments, the third edge 30c of the first layer 30 is offset from the third edge 32c of the second layer 32 by a third distance D3. In some embodiments, the fourth edge 30d of the first layer 30 is offset from the fourth edge 32d of the second layer 32 by a fourth distance D4.

In some embodiments, the first distance D1, the second distance D2, the third distance D3 and the fourth distance D4 are equal to one another. In some embodiments, the first distance D1, the second distance D2, the third distance D3 and the fourth distance D4 are all different from one another. In some embodiments, the first distance D1 is equal to the second distance D2. In some embodiments, the third distance D3 is equal to the fourth distance D4.

In some embodiments, the first distance D1 is 1 mm to 10 mm. In some embodiments, the first distance D1 is 2 mm to 10 mm. In some embodiments, the first distance D1 is 3 mm to 10 mm. In some embodiments, the first distance D1 is 4 mm to 10 mm. In some embodiments, the first distance D1 is 5 mm to 10 mm. In some embodiments, the first distance D1 is 6 mm to 10 mm. In some embodiments, the first distance D1 is 7 mm to 10 mm. In some embodiments, the first distance D1 is 8 mm to 10 mm. In some embodiments, the first distance D1 is 9 mm to 10 mm. In some embodiments, the first distance D1 is 1 mm. In some embodiments, the first distance D1 is 2 mm. In some embodiments, the first distance D1 is 3 mm. In some embodiments, the first distance D1 is 4 mm. In some embodiments, the first distance D1 is 5 mm. In some embodiments, the first distance D1 is 6 mm. In some embodiments, the first distance D1 is 7 mm. In some embodiments, the first distance D1 is 8 mm. In some embodiments, the first distance D1 is 9 mm. In some embodiments, the first distance D1 is 10 mm.

In some embodiments, the first distance D2 is 1 mm to 10 mm. In some embodiments, the first distance D2 is 2 mm to 10 mm. In some embodiments, the first distance D2 is 3 mm to 10 mm. In some embodiments, the first distance D2 is 4 mm to 10 mm. In some embodiments, the first distance D2 is 5 mm to 10 mm. In some embodiments, the first distance D2 is 6 mm to 10 mm. In some embodiments, the first distance D2 is 7 mm to 10 mm. In some embodiments, the first distance D2 is 8 mm to 10 mm. In some embodiments, the first distance D2 is 9 mm to 10 mm. In some embodiments, the first distance D2 is 1 mm. In some embodiments, the first distance D2 is 2 mm. In some embodiments, the first distance D2 is 3 mm. In some embodiments, the first distance D2 is 4 mm. In some embodiments, the first distance D2 is 5 mm. In some embodiments, the first distance D2 is 6 mm. In some embodiments, the first distance D2 is 7 mm. In some embodiments, the first distance D2 is 8 mm. In some embodiments, the first distance D2 is 9 mm. In some embodiments, the first distance D2 is 10 mm.

In some embodiments, the first distance D3 is 1 mm to 10 mm. In some embodiments, the first distance D3 is 2 mm to 10 mm. In some embodiments, the first distance D3 is 3 mm to 10 mm. In some embodiments, the first distance D3 is 4 mm to 10 mm. In some embodiments, the first distance D3 is 5 mm to 10 mm. In some embodiments, the first distance D3 is 6 mm to 10 mm. In some embodiments, the first distance D3 is 7 mm to 10 mm. In some embodiments, the first distance D3 is 8 mm to 10 mm. In some embodiments, the first distance D3 is 9 mm to 10 mm. In some embodiments, the first distance D3 is 1 mm. In some embodiments, the first distance D3 is 2 mm. In some embodiments, the first distance D3 is 3 mm. In some embodiments, the first distance D3 is 4 mm. In some embodiments, the first distance D3 is 5 mm. In some embodiments, the first distance D3 is 6 mm. In some embodiments, the first distance D3 is 7 mm. In some embodiments, the first distance D3 is 8 mm. In some embodiments, the first distance D3 is 9 mm. In some embodiments, the first distance D3 is 10 mm.

In some embodiments, the first distance D4 is 1 mm to 10 mm. In some embodiments, the first distance D4 is 2 mm to 10 mm. In some embodiments, the first distance D4 is 3 mm to 10 mm. In some embodiments, the first distance D4 is 4 mm to 10 mm. In some embodiments, the first distance D4 is 5 mm to 10 mm. In some embodiments, the first distance D4 is 6 mm to 10 mm. In some embodiments, the first distance D4 is 7 mm to 10 mm. In some embodiments, the first distance D4 is 8 mm to 10 mm. In some embodiments, the first distance D4 is 9 mm to 10 mm. In some embodiments, the first distance D4 is 1 mm. In some embodiments, the first distance D4 is 2 mm. In some embodiments, the first distance D4 is 3 mm. In some embodiments, the first distance D4 is 4 mm. In some embodiments, the first distance D4 is 5 mm. In some embodiments, the first distance D4 is 6 mm. In some embodiments, the first distance D4 is 7 mm. In some embodiments, the first distance D4 is 8 mm. In some embodiments, the first distance D4 is 9 mm. In some embodiments, the first distance D4 is 10 mm.

Referring to FIGS. 1 through 4, 6 and 7, In some embodiments, the glass layer 22 includes a first edge 22a, a second edge 22b opposite the first edge 22a, a third edge 22c extending from the first edge 22a to the second edge 22b, and a fourth edge 22d opposite the third edge 22c and extending from the first edge 22a to the second edge 22b. In some embodiments, the first edge 22a is offset from the first edge 32a of the second layer 32.

In some embodiments, the first edge 22a is offset from the first edge 32a of the second layer 32 by the first distance D1. In some embodiments, the second edge 22b of the glass layer 22 is offset from the second edge 32b of the second layer 32. In some embodiments, the second edge 22b of the glass layer 22 is offset from the second edge 32b of the second layer 32 by the second distance D2. In some embodiments, the third edge 22c of the glass layer 22 is offset from the third edge 32c of the second layer 32. In some embodiments, the third edge 22c of the glass layer 22 is offset from the third edge 32c of the second layer 32 by the third distance D3. In some embodiments, the fourth edge 22d of the glass layer 22 is offset from the fourth edge 32d of the second layer 32. In some embodiments, the fourth edge 22d of the glass layer 22 is offset from the fourth edge 32d of the second layer 32 by the fourth distance D4.

In some embodiments, the first edge 22a of the glass layer 22 is offset from the first edge 30a of the first layer 30. In some embodiments, the first edge 22a of the glass layer 22 is offset from the first edge 30a of the first layer 30 by the first distance D1. In some embodiments, the second edge 22b of the glass layer 22 is offset from the second edge 30b of the first layer 30. In some embodiments, the second edge 22b of the glass layer 22 is offset from the second edge 30b of the first layer 30 by the second distance D2. In some embodiments, the third edge 22c of the glass layer 22 is offset from the third edge 30c of the first layer 30. In some embodiments, the third edge 22c of the glass layer 22 is offset from the third edge 30c of the first layer 30 by the third distance D3. In some embodiments, the fourth edge 22d of the glass layer 22 is offset from the fourth edge 30d of the first layer 30. In some embodiments, the fourth edge 22d of the glass layer 22 is offset from the fourth edge 30d of the first layer 30 by the fourth distance D4.

In some embodiments, the photovoltaic module 10 is laminated. In some embodiments, all of the previously mentioned applicable layers of the photovoltaic module 10 are laminated in one lamination step. In some embodiments, a method of making the photovoltaic module 10 includes a first lamination step and a second lamination step. In an embodiment, the first lamination step includes laminating the layers of the frontsheet 16. In an embodiment, the first lamination step includes laminating the glass layer 22, the polymer layer 22, and the adhesive layer 24. In some embodiments, the second lamination step includes laminating the frontsheet 16 with the remaining layers of the photovoltaic module 10. In an embodiment, the second lamination step includes laminating the frontsheet 16, the encapsulant 14, the at least one solar cell 12, and the backsheet 28.

In some embodiments, a headlap portion is attached to the backsheet 28. In some embodiments, the headlap portion is attached to the first layer 30. In some embodiments, the headlap portion is attached to the second layer 32. In some embodiments, headlap portion and the backsheet 28 are welded to one another. In some embodiments, headlap portion and the backsheet 28 are ultrasonically welded to one another. In some embodiments, headlap portion and the backsheet 28 are heat welded to one another. In some embodiments, headlap portion and the backsheet 28 are thermally bonded to one another. In some embodiments, headlap portion and the backsheet 28 are adhered to one another by an adhesive. In some embodiments, headlap portion and the backsheet 28 are laminated. In some embodiments, headlap portion and the backsheet 28 are co-extruded. In some embodiments, headlap portion and the backsheet 28 are mechanically attached to one another. In some embodiments, headlap portion and the backsheet 28 are attached to one another by at least one fastener. In some embodiments, headlap portion and the backsheet 28 are attached to one another by a plurality of fasteners. In some embodiments, headlap portion and the backsheet 28 are attached to one another by deforming one of headlap portion and the backsheet 28 into the other one of headlap portion and the backsheet 28. In some embodiments, headlap portion and the backsheet 28 are attached to one another by deforming a portion of one of headlap portion and the backsheet 28 into the other one of headlap portion and the backsheet 28. In some embodiments, headlap portion and the backsheet 28 are attached to one another by forming at least one hole in one or both of headlap portion and the backsheet 28 and dispensing molten material into the at least one hole to connect headlap portion and the backsheet 28. In some embodiments, non-limiting examples of fasteners, fastening means and methods for fastening, connecting and attaching the first layer 30 to the second layer 32 are disclosed in U.S. Pat. No. 7,833,371 to Binkley et al, U.S. Pat. No. 8,006,457 to Binkley et al, U.S. Pat. No. 8,127,514 to Binkley et al, and U.S. Pat. No. 8,316,608 to Binkley et al, each of which is incorporated by reference herein in its entirety.

Figure 8:
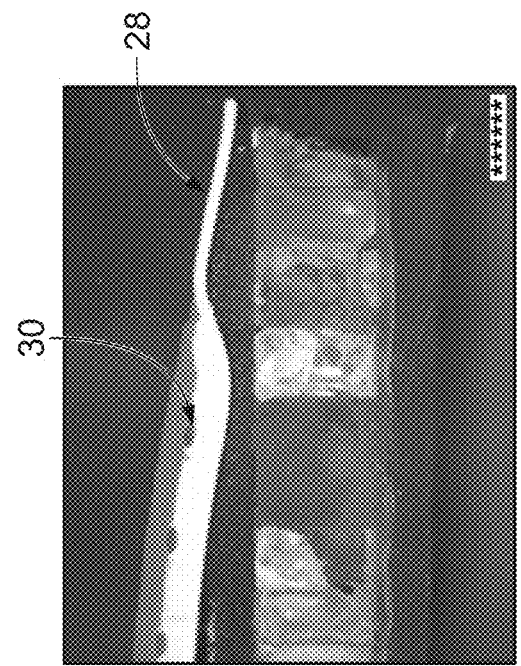
FIGS. 8 through 10 show enlarged views of a portion of some embodiments of a photovoltaic module.
Figure 9:
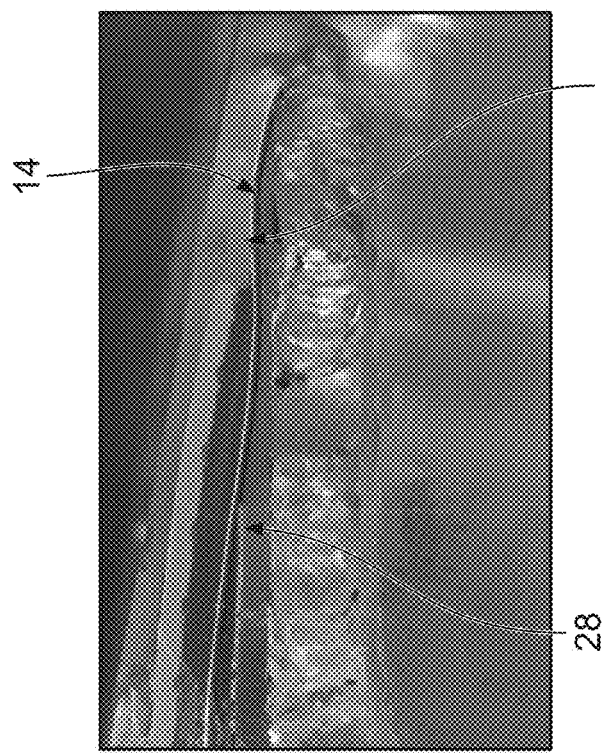
Figure 10:
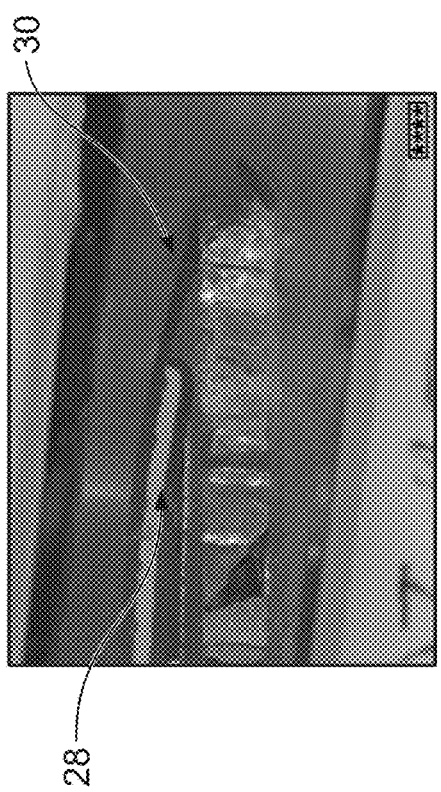

Referring to FIGS. 8 through 10, in some embodiments, the offset of the backsheet 28 (i.e., either the first layer 30 or the second layer 32) from the glass layer 22 reduces pinchoff on the edges of the photovoltaic module 10. In some embodiments, as used herein, the terms "pinchoff" or "pinch" is that the thicknesses of the layers of the photovoltaic module 10 causes pressure at the edges 22a through 22d of the glass layer 22, which can squeeze the encapsulant 14 while in a liquid form during lamination of the photovoltaic module 10, and could result in reduced bond line thickness. In some embodiments, pinchoff can result in premature delamination of the backsheet 28 from the glass layer 22. In some embodiments, the offset of the backsheet 28 (i.e., either the first layer 30 or the second layer 32) from the glass layer 22 reduces visibility of any scrim included within the backsheet 28. In some embodiments, the offset of one or more of the edges 32a, 32b, 32c, 32d of the second layer 32 relative to the corresponding edges 30a, 30b, 30c, 30d of the first layer 30 reduces the potential of the first layer 30 to pinch. In some embodiments, the offset of one or more of the edges 30a, 30b, 30c, 30d of the first layer 30 relative to the corresponding edges 32a, 32b, 32c, 32d of the second layer 32 reduces the potential of the second layer 32 to pinch. In some embodiments, each of the distances D1 through D4 is of a sufficient amount so as to enable the edges 30a through 30d of the first layer 30 and/or the edges 32a through 32d of the second layer 32 to reduce the potential of the first layer 30 and the second layer 32 to pinch.

In some embodiments, each of the distances D1 through D4 is of a sufficient amount so as to enable the edges 30a through 30d of the first layer 30 and/or the edges 32a through 32d of the second layer 32, as applicable, to be cut or trimmed when the photovoltaic module 10 is installed on a roof deck 90 for aesthetically matching the photovoltaic module 10 with other ones of the photovoltaic module 10.

In some embodiments, the roof deck 90 is a steep slope roof deck. As defined herein, a "steep slope roof deck" is any roof deck that is disposed on a roof having a pitch of Y/X, where Y and X are in a ratio of 4:12 to 12:12, where Y corresponds to the "rise" of the roof, and where X corresponds to the "run" of the roof.

In some embodiments, the roof deck 90 may be a sloped roof of a structure. As used herein, a "sloped" roof deck is a roof deck that has a slope less than a slope of a steep slope roof deck, but is not a flat roof deck.

In some embodiments, the roof deck 90 is a component of a commercial roof. In some embodiments, the roof deck 90 has a slope of 3 inches per foot or less. In some embodiments, the roof deck 90 has a slope of 0.25 inch to 3 inches per foot. In some embodiments, the roof deck 90 has a slope of 0.25 inch to 2 inches per foot. In some embodiments, the roof deck 90 has a slope of 0.25 inch to 1 inch per foot. In some embodiments, the roof deck 90 has a slope of 1 inch to 3 inches per foot. In some embodiments, the roof deck 90 has a slope of 1 inch to 2 inches per foot. In some embodiments, the roof deck 90 has a slope of 2 inches to 3 inches per foot.

In some embodiments, a system of at least one of the photovoltaic modules 10 is installed on the roof deck 90. In some embodiments, a system of a plurality of the photovoltaic modules 10 is installed on the roof deck 90. In some embodiments, the plurality of the photovoltaic modules 10 includes two of the photovoltaic modules 10. In some embodiments, the plurality of the photovoltaic modules 10 includes three of the photovoltaic modules 10. In some embodiments, the plurality of the photovoltaic modules 10 includes four of the photovoltaic modules 10. In some embodiments, the plurality of the photovoltaic modules 10 includes five of the photovoltaic modules 10. In some embodiments, the plurality of the photovoltaic modules 10 includes six of the photovoltaic modules 10. In some embodiments, the plurality of the photovoltaic modules 10 includes more than six of the photovoltaic modules 10. In some embodiments, the plurality of the photovoltaic modules 10 is installed in an array on the roof deck 90. In some embodiments, the array includes a plurality of subarrays. In some embodiments, the array includes two subarrays. In some embodiments, the array includes three subarrays. In some embodiments, the array includes four subarrays. In some embodiments, the array includes five subarrays. In some embodiments, the array includes six subarrays. In some embodiments, the array includes more than six subarrays.

In some embodiments, the plurality of photovoltaic modules 10 is installed directly to the roof deck 90. In some embodiments, each of the plurality of photovoltaic modules 10 is installed on the roof deck 90 by a plurality of fasteners. In some embodiments, the plurality of fasteners are installed through the headlap portion. In some embodiments, the plurality of fasteners includes a plurality of nails. In some embodiments, the plurality of fasteners includes a plurality of screws. In some embodiments, the plurality of fasteners includes a plurality of rivets. In some embodiments, the plurality of fasteners includes a plurality of staples.

In some embodiments, each of the plurality of photovoltaic modules 10 is installed on the roof deck 90 by an adhesive. In some embodiments, the adhesive is adhered directly to the roof deck 90. In some embodiments, the adhesive is adhered to an underlayment. In some embodiments, the underlayment is adhered directly to the roof deck 90. In some embodiments, the adhesive is located on a rear surface of the photovoltaic module 10. In some embodiments, the adhesive includes at least one adhesive strip. In some embodiments, the adhesive includes a plurality of adhesive strips. In some embodiments, the plurality of adhesive strips is arranged intermittently. In some embodiments, the adhesive is located proximate to one edge of the photovoltaic module 10. In some embodiments, the adhesive is a peel and stick film sheet. In some embodiments, the peel and stick film sheet includes at least one sheet of film removably attached to the rear surface. In some embodiments, the peel and stick film sheet is composed of EverGuard Freedom HW peel and stick membrane manufactured by GAF. In some embodiments, the adhesive includes polyvinyl butyrate, acrylic, silicone, or polycarbonate. In some embodiments, the adhesive includes pressure sensitive adhesives.

In some embodiments, one or more of the photovoltaic modules 10 is a photovoltaic module shown and described in either or both of U.S. application Ser. No. 17/831,307, filed Jun. 2, 2022, titled "Roofing Module System," and published under U.S. Patent Application Publication No. 2022-0393637 on Dec. 8, 2022; and/or U.S. application Ser. No. 18/169,718, filed Feb. 15, 2023, titled "Roofing Module System," and published under U.S. Patent Application Publication No. 2023-0203815 on Jun. 29, 2023, the disclosures of each of which are incorporated by reference herein in their entireties. In some embodiments, the photovoltaic module includes a structure, composition, components, and/or function similar to those of one or more embodiments of the photovoltaic modules disclosed in PCT International Patent Publication No. WO 2022/051593, Application No. PCT/US2021/049017, published Mar. 10, 2022, entitled "Building Integrated Photovoltaic System," owned by GAF Energy LLC, and U.S. Pat. No. 11,251,744 to Bunea et al., issued Feb. 15, 2022, entitled "Photovoltaic Shingles and Methods of Installing Same," the contents of each of which are incorporated by reference herein in their entirety.

In some embodiments, the system includes a plurality of roofing shingles. In some embodiments, the photovoltaic modules 10 have an appearance that aesthetically match the appearance of the plurality of roofing shingles. In some embodiments, the roofing shingle is a cuttable roofing module. In some embodiments, the roofing shingle is a nailable roofing module. In some embodiments, the roofing shingle is a cuttable roofing module shown and described in U.S. application Ser. No. 17/831,307, filed Jun. 2, 2022, titled "Roofing Module System," and published under U.S. Patent Application Publication No. 2022-0393637 on Dec. 8, 2022; and/or U.S. application Ser. No. 18/169,718, filed Feb. 15, 2023, titled "Roofing Module System," and published under U.S. Patent Application Publication No. 2023-0203815 on Jun. 29, 2023, the disclosures of each of which are incorporated by reference herein in their entireties.

What is claimed is:

1. A system, comprising:
   a plurality of photovoltaic modules installed on a roof deck,
   wherein each of the photovoltaic modules includes
      at least one solar cell,
      a first encapsulant encapsulating the at least one solar cell,
         wherein the first encapsulant includes a first surface and a second surface opposite the first surface, a frontsheet juxtaposed with the first surface of the first encapsulant,
  wherein the frontsheet includes a glass layer, and
a backsheet juxtaposed with the second surface of the first encapsulant,
  wherein the backsheet includes
    a first layer,
      wherein the first layer includes a first edge, a second edge opposite the first edge, a third edge extending from the first edge to the second edge, and a fourth edge opposite the third edge and extending from the first edge to the second edge,
      wherein the first layer includes a first length extending from the first edge to the second edge, and
    a second layer adjacent and below the first layer,
      wherein the second layer includes a first edge, a second edge opposite the first edge of the second layer, a third edge extending from the first edge of the second layer to the second edge of the second layer, and a fourth edge opposite the third edge of the second layer and extending from the first edge of the second layer to the second edge of the second layer,
      wherein the second layer includes a second length extending from the first edge of the second layer to the second edge of the second layer, and wherein the first length is greater than the second length,
      wherein the second layer is the lowermost layer of the photovoltaic module,
    wherein the first edge of the first layer is offset and extends outwardly from the first edge of the second layer,
    wherein the second edge of the first layer is offset and extends outwardly from the second edge of the second layer,
    wherein the third edge of the first layer is offset from the third edge of the second layer, and
    wherein the fourth edge of the first layer is offset from the fourth edge of the second layer, and
    an adhesive layer between the first layer and the second layer,
    wherein the adhesive layer includes a first edge and a second edge opposite the first edge of the adhesive layer,
    wherein the adhesive layer includes a third length extending from the first edge of the adhesive layer to the second edge of the adhesive layer, and
    wherein the third length is equal to the second length.

2. The system of claim 1, wherein the first layer includes a first width extending from the third edge of the first layer to the fourth edge of the first layer, wherein the second layer includes a second width extending from the third edge of the second layer to the fourth edge of the second layer, and wherein the first width is greater than the second width.

3. The system of claim 2, wherein the second layer is composed of thermoplastic polyolefin (TPO).

4. The system of claim 2, wherein the first layer is composed of a polymer.

5. The system of claim 4, wherein the first layer is composed of thermoplastic polyolefin (TPO).

6. The system of claim 2, wherein the glass layer includes:
a first edge,
a second edge opposite the first edge of the glass layer,
a third edge extending from the first edge of the glass layer to the second edge of the glass layer, and
a fourth edge opposite the third edge of the glass layer and extending from the first edge of the glass layer to the second edge of the glass layer,
wherein the first edge of the glass layer is offset from the first edge of the second layer,
wherein the second edge of the glass layer is offset from the second edge of the second layer,
wherein the third edge of the glass layer is offset from the third edge of the second layer, and
wherein the fourth edge of the glass layer is offset from the fourth edge of the second layer.

7. The system of claim 1, wherein the first edge of the first layer is offset from the first edge of the second layer by a first distance, wherein the second edge of the first layer is offset from the second edge of the second layer by a second distance, wherein the third edge of the first layer is offset from the third edge of the second layer by a third distance, and wherein the fourth edge of the first layer is offset from the fourth edge of the second layer by a fourth distance.

8. The system of claim 7, wherein the first distance, the second distance, the third distance and the fourth distance are equal to one another.

9. The system of claim 7, wherein the first distance is equal to the second distance, and wherein the third distance is equal to the fourth distance.

10. The system of claim 1, wherein the frontsheet includes a polymer layer and a second encapsulant, and wherein the polymer layer is attached to the glass layer by the second encapsulant.

11. A photovoltaic module, comprising:
at least one solar cell,
a first encapsulant encapsulating the at least one solar cell,
  wherein the first encapsulant includes a first surface and a second surface opposite the first surface,
a frontsheet juxtaposed with the first surface of the first encapsulant,
  wherein the frontsheet includes a glass layer, and
a backsheet juxtaposed with the second surface of the first encapsulant,
  wherein the backsheet includes
    a first layer,
      wherein the first layer includes a first edge, a second edge opposite the first edge, a third edge extending from the first edge to the second edge, and a fourth edge opposite the third edge and extending from the first edge to the second edge,
      wherein the first layer includes a first length extending from the first edge to the second edge, and a second layer attached to and below the first layer,
      wherein the second layer includes a first edge, a second edge opposite the first edge of the second layer, a third edge extending from the first edge of the second layer to the second edge of the second layer, and a fourth edge opposite the third edge of the second layer and extending from the first edge of the second layer to the second edge of the second layer,
      wherein the second layer includes a second length extending from the first edge of the second layer to the second edge of the second layer, and wherein the first length is greater than the second length, wherein the second layer is the lowermost layer of the photovoltaic module, wherein the first edge of the first layer is offset and extends outwardly from the first edge of the second layer, wherein the second edge of the first layer is offset and extends outwardly from the second edge of the second layer, wherein the third edge of the first layer is offset from the third edge of the second layer, and wherein the fourth edge of the first layer is offset from the fourth edge of the second layer, wherein the second layer forms a lower surface of the photovoltaic module, and wherein at least one of the first layer and the second layer is composed of thermoplastic polyolefin (TPO), and an adhesive layer between the first layer and the second layer, wherein the adhesive layer includes a first edge and a second edge opposite the first edge of the adhesive layer, wherein the adhesive layer includes a third length extending from the first edge of the adhesive layer to the second edge of the adhesive layer, and wherein the third length is equal to the second length.

12. A system, comprising:

a plurality of photovoltaic modules installed on a roof deck, wherein each of the photovoltaic modules includes
at least one solar cell,
a first encapsulant encapsulating the at least one solar cell,
wherein the first encapsulant includes a first surface and a second surface opposite the first surface,
a frontsheet juxtaposed with the first surface of the first encapsulant, and
a backsheet juxtaposed with the second surface of the first encapsulant,
wherein the backsheet includes
a first layer,
wherein the first layer includes a first edge and a second edge opposite the first edge,
wherein the first layer includes a first length extending from the first edge to the second edge, and a second layer adjacent and below the first layer,
wherein the second layer includes a first edge and a second edge opposite the first edge of the second layer,
wherein the second layer includes a second length extending from the first edge of the second layer to the second edge of the second layer, and wherein the first length is greater than the second length,
wherein the second layer is the lowermost layer of the photovoltaic module,
wherein the first edge of the first layer is offset and extends outwardly from the first edge of the second layer, and
wherein the second edge of the first layer is offset and extends outwardly from the second edge of the second layer, and
an adhesive layer between the first layer and the second layer,
wherein the adhesive layer includes a first edge and a second edge opposite the first edge of the adhesive layer,
wherein the adhesive layer includes a third length extending from the first edge of the adhesive layer to the second edge of the adhesive layer, and
wherein the third length is equal to the second length.

13. The system of claim 12, wherein the second layer is composed of thermoplastic polyolefin (TPO).

14. The system of claim 12, wherein the first layer is composed of a polymer.

15. The system of claim 14, wherein the first layer is composed of thermoplastic polyolefin (TPO).

16. The system of claim 12, wherein the frontsheet includes a glass layer.

17. The system of claim 16, wherein the frontsheet includes a polymer layer and a second encapsulant, and wherein the polymer layer is attached to the glass layer by the second encapsulant.

18. The system of claim 16, wherein the glass layer includes a first edge, and a second edge opposite the first edge of the glass layer, wherein the first edge of the glass layer is offset from the first edge of the second layer, and wherein the second edge of the glass layer is offset from the second edge of the second layer.

19. The system of claim 18, wherein the glass layer includes a third edge and a fourth edge opposite the third edge of the glass layer, wherein the third edge of the glass layer is offset from the third edge of the second layer, and wherein the fourth edge of the glass layer is offset from the fourth edge of the second layer.

* * * * *